US006470039B1

(12) United States Patent
Ukita

(10) Patent No.: US 6,470,039 B1
(45) Date of Patent: Oct. 22, 2002

(54) SEMICONDUCTOR LASER AND PRODUCTION METHOD THEREOF

(75) Inventor: Masakazu Ukita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/457,133

(22) Filed: Dec. 9, 1999

(30) Foreign Application Priority Data

Dec. 10, 1998 (JP) .......................................... 10-351623

(51) Int. Cl.[7] .............................. H01S 5/00; H01S 3/06
(52) U.S. Cl. ............................ 372/46; 372/45; 372/66
(58) Field of Search ............................ 372/43–46, 66

(56) References Cited

U.S. PATENT DOCUMENTS

| 5,581,570 | A | * | 12/1996 | Yoshida et al. | 372/46 |
| 5,850,411 | A | * | 12/1998 | Major, Jr. et al. | 372/45 |
| 5,976,957 | A | * | 11/1999 | Westwater et al. | 438/478 |
| 6,036,773 | A | * | 3/2000 | Wang et al. | 117/97 |
| 6,091,755 | A | * | 7/2000 | Sanders et al. | 372/92 |
| 6,160,824 | A | * | 12/2000 | Meissner et al. | 372/7 |

* cited by examiner

Primary Examiner—Paul Ip
Assistant Examiner—James Menefee
(74) Attorney, Agent, or Firm—Sonnenschein, Nath & Rosenthal

(57) ABSTRACT

A semiconductor laser basically includes a first cladding layer; an active layer; a second cladding layer; and a current constriction means for defining a current injection region in the active layer. The active layer has a gain region which acquires an optical gain by current injection thereto; a saturable absorption region in which current injection thereto little occurs and light effusion thereto occurs; and an outside region, being in contact with the saturable absorption region, in which current injection thereto little occurs and light effusion thereto little occurs. In this semiconductor laser, an effective band gap of the saturable absorption region is set to be larger than that of the outside region. With this configuration, carriers in the saturable absorption region are efficiently migrated to the outside region, so that the carrier lifetime in the saturable absorption region is actually shortened. As a result, the semiconductor laser can sustain the self pulsation at a high light output and a high operational temperature, and further can be produced with a good production yield.

32 Claims, 10 Drawing Sheets

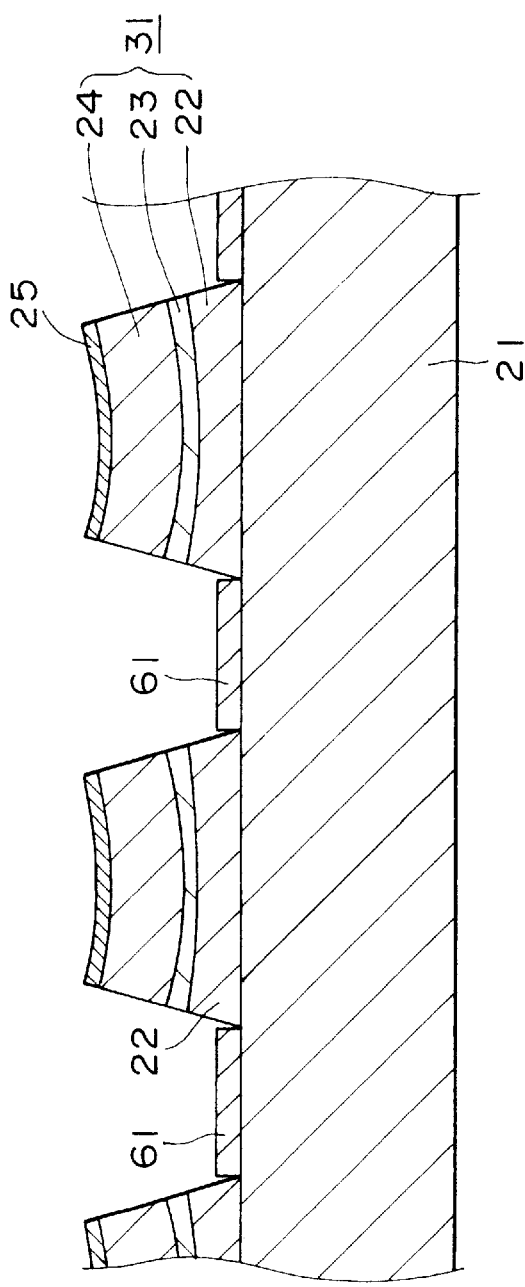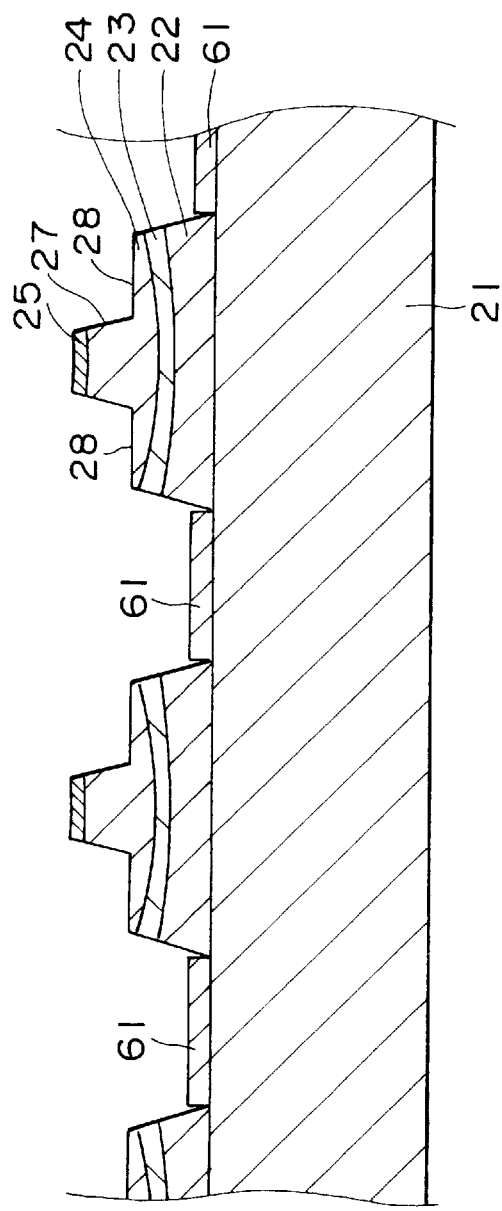

SEMICONDUCTOR LASER AND PRODUCTION METHOD THEREOF

BACKGROUND OF THE INVENTION

The present invention relates to a semiconductor laser and a production method thereof, and particularly to a self pulsation type semiconductor laser and a production method thereof.

FIG. 16 is a schematic sectional view, seen along the direction perpendicular to the resonator length direction, of a related art inner stripe type semiconductor laser.

Layers are epitaxially grown in sequence on the entire surface of a substrate 1 made from n-type GaAs: a first cladding layer 2 made from n-type $Al_{0.5}Ga_{0.5}As$, an active layer 3 made from $Al_{0.15}Ga_{0.85}As$, a second cladding layer 4 made from p-type $Al_{0.5}Ga_{0.5}As$, and a heavily doped contact layer 5 made from p-type GaAs. The stacked layers are selectively etched from the contact layer 5 side up to a depth reaching the inner portion of the second cladding layer 4, to form two grooves 8, thereby forming a stripe-like ridge 7 extending in the direction perpendicular to the paper plane of FIG. 16 between the grooves 8. In this case, the depth of the groove 8 is selected such that the second cladding layer 4 having a specific thickness "d" remains under the grooves 8.

A current constriction layer 6 made from n-type GaAs is grown in such a manner as to bury the grooves 8.

A first electrode 9 is formed on the contact layer 5 and the current constriction layer 6 in such a manner as to be in ohmic-contact therewith, and a second electrode 10 is formed on the back surface of the substrate 1 in such a manner as to be in ohmic-contact therewith.

In the semiconductor laser having such a configuration, the active layer 3 is divided into a gain region 11, two saturable absorption regions 12 on both sides of the gain region 11, and two outside regions 13 on both sides of the saturable absorption regions 12.

A current, which is restrictively supplied to the stripe-like ridge 7 by the effect of the current constriction layer 6, is injected in the gain region 11 of the active layer, with a result that a gain necessary for laser oscillation occurs only in the gain region 11 of the active layer 3.

The saturable absorption region 12 does not undergo current injection, and acts as a light saturable absorber which does not absorb light when the light intensity increases to some extent and becomes a transparent body.

The saturable absorber, therefore, acts as a Q switch, which is capable of adjusting the ratio of light effused from the gain region 11 to the saturable absorption region 12 by selecting the width "W" of the gain region 11 and the thickness "d" of each of portions, on both sides of the stripe-like ridge 7, of the second cladding layer 4. The output of the laser light is periodically changed by adjusting the ratio of light effused from the gain region 11 to the saturable absorption region 12, to thus constitute a self pulsation type semiconductor laser.

A light distribution region upon operation is schematically shown by a chain line "a" in FIG. 16.

Such a self pulsation laser, which is low in coherence of laser light and also low in a so-called optical feedback induced noise due to an unstable laser oscillation state caused by return of light, having been emitted from the laser, to the laser again, is useful as an optical disk light source or a high-speed LAN (Local Area Network) light source.

It is experientially known that the above-described self pulsation laser is obtained by selecting the width "W" of the gain region 11 at a narrow value (generally, 5 $\mu$m or less), and setting a difference $\Delta n$ in effective refractive index between the gain region 11 and the saturable absorption region 12 at a small value (generally, $\Delta n \leq 0.01$) by adjusting the thickness "d" of each of the portions, on both the sides of the stripe-like ridge 7, of the second cladding layer 4. However, since the allowable ranges of the width "W" and the thickness "d" are narrow, it is difficult to adjust the width "W" and the thickness "d" at the etching step for forming the grooves 8.

Accordingly, it is difficult to sustain the self pulsation at a high light output, for example, 10 mW, and also it is difficult to sustain the self pulsation at a high operational temperature, for example, 70° C. Further, it is difficult to produce a self pulsation laser with a high production yield.

SUMMARY OF THE INVENTION

An object of the present invention is to provide a self pulsation type semiconductor laser capable of sustaining the self pulsation at a high light output and/or at a high operational temperature, and to provide a method of producing the semiconductor laser.

Another object of the present invention is to provide a self pulsation type semiconductor laser which is produceable with a high production yield, and to provide a method of producing the semiconductor laser.

A semiconductor laser according to the present invention basically includes a first cladding layer, an active layer, a second cladding layer, and a current constriction layer.

The active layer may be formed in such a manner that it has a gain region which is defined as a current injection region by the current constriction means and which is capable of acquiring an optical gain by current injection thereto; a saturable absorption region in which there occurs light effusion thereto; and an outside region in which there little occurs light effusion thereto. The active layer may be also formed in such a manner that it has only a gain region, and a saturable absorption layer, which has a saturable absorption region disposed at such a position as to allow the region to absorb light from the gain region and also has an outside region disposed outside the saturable absorption region in such a manner as to be in contact therewith, is provided, separately from the active layer, in at least one of the first and second cladding layers.

In each of these configurations, an effective band gap of the saturable absorption region may be larger than that of the outside region.

A method of producing a semiconductor laser according to the present invention basically includes steps of sequentially growing a first cladding layer, an active layer, and a second cladding layer on a substrate, and forming a current constriction means.

The current constriction means can be formed in accordance with a related art method.

In this method, the active layer may be formed in such a manner that it has a gain region which is defined as a current injection region by the current constriction means and which is capable of acquiring an optical gain by current injection thereto; a saturable absorption region in which there occurs light effusion thereto; and an outside region in which there little occurs light effusion thereto. The active layer may also be formed in such a manner that it has only a gain region, and a saturable absorption layer, having a saturable absorption region, disposed at such a position as to allow the region to absorb light from the gain region, in which there occurs light effusion thereto, and also having an outside region, being in contact with the saturable absorption region, in which there little occurs light effusion thereto, is provided separately from the active layer.

In each of these methods, an effective band gap of the saturable absorption region may be larger than that of the outside region.

According to the semiconductor laser of the present invention having the above-described configuration, it is possible to sustain the self pulsation at a high light output and/or a high operational temperature.

With respect to a self pulsation type semiconductor laser, it is known that the function of a saturable absorption region can be made higher by making the carrier lifetime in the saturable absorption region shorter than the carrier lifetime in a gain region and/or by making the differential gain in the saturable absorption region larger than the differential gain in the gain region (see H. Kawaguchi, Appl. Phys. Lett., 45(12)pp. 1264 (1984); M. Ueno and R. Lang, J. Appl. Phys., 58(4)pp. 1689 (1985); and H. Adachi, S. Kaminoyama, I. Kidoguchi, and T. Uenoyama, IEEE Photon. Technol. Lett., 7(12)pp. 1406 (1995)).

By making higher the function of the saturable absorption region as described above, it is possible to sustain the self pulsation at a higher light output and/or a higher operational temperature.

On the other hand, while one factor of defining the carrier lifetime in a saturable absorption region is physical properties of a semiconductor crystal forming the saturable absorption region, the present inventor has found the fact that, in the case where carriers can be migrated from the saturable absorption region to the outside region being in contact therewith, the migration of the carriers becomes a factor of defining an effective carrier lifetime in the saturable absorption region.

To be more specific, if carriers are readily migrated from the saturable absorption region to the outside region, the carrier lifetime in the saturable absorption region is actually shorter than the carrier lifetime defined by the physical properties of the semiconductor crystal forming the saturable absorption region. On the contrary, if the carriers are not migrated or slowly migrated from the saturable absorption region to the outside region, the carrier lifetime in the saturable absorption region is actually equal to or only slightly shorter than the carrier lifetime defined by the physical properties of the semiconductor crystal forming the saturable absorption region.

The semiconductor laser of the present invention has been made on the basis of the above-described knowledge, and is characterized in that an effective band gap of a saturable absorption region is set to be larger than that of an outside region. With this configuration, because of a property of carriers easy to be migrated from a region having a large effective band gap to a region having a small effective band gap, carriers generated in the saturable absorption region due to optical absorption are readily migrated to the outside region having a small effective band gap, so that the carrier lifetime in the saturable absorption region is actually shortened, to thereby enhance the function of the saturable absorption region.

The semiconductor laser of the present invention thus obtained can sustain the self pulsation at a high light output and/or a high operational temperature.

BRIEF DESCRIPTION OF THE DRAWINGS

FIGS. 13A and 13B are schematic sectional views showing a method of producing a semiconductor laser according to a further embodiment of the present invention;

DETAILED DESCRIPTION OF THE PREFERRED EMBODIMENTS

Figure 1:
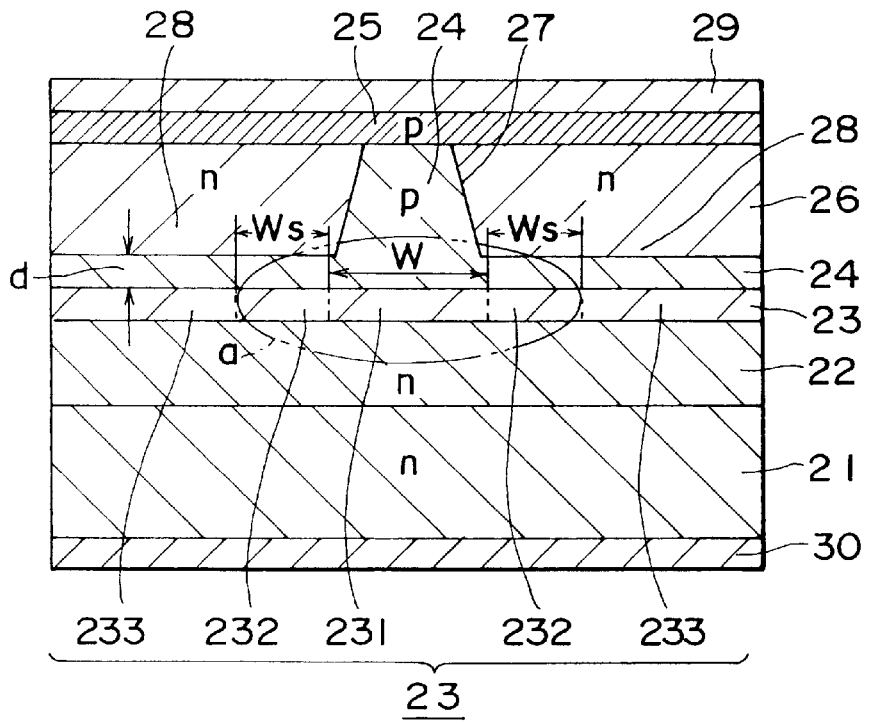
FIG. 1 is a schematic sectional view of a semiconductor laser according to one embodiment of the present invention.

A first semiconductor laser of the present invention basically includes: a first cladding layer; an active layer; a second cladding layer; and a current constriction means for defining a current injection region in the active layer. The active layer has a gain region which acquires an optical gain by current injection thereto; a saturable absorption region in which current injection thereto little occurs and light effusion thereto occurs; and an outside region, being in contact with the saturable absorption region, in which current injection thereto little occurs and light effusion thereto little occurs. In this semiconductor laser, an effective band gap of the saturable absorption region is set to be larger than that of the outside region.

A second semiconductor laser of the present invention basically includes: a first cladding layer; an active layer; a second cladding layer; and a current constriction means for defining a current injection region in the active layer. The active layer has a gain region which acquires an optical gain by current injection. A saturable absorption layer is provided in at least one of the first and second cladding layers. The saturable absorption layer has a saturable absorption region which has an effective band gap nearly equal to or narrower than that of the active layer and in which light effusion thereto occurs, and an outside region, being in contact with the saturable absorption region, which has an effective band gap smaller than that of the saturable absorption region and in which light effusion thereto little occurs. The saturable absorption region is disposed at a position near the active layer for effectively absorbing light from the gain region.

A first method of producing a semiconductor laser according to the present invention, includes: a first growth step of sequentially growing, on a substrate, a first cladding layer, a first active layer for forming a gain region, and a second cladding layer, to form a stacked semiconductor layer; a first groove formation step of forming stripe-like first grooves in part of the stacked semiconductor layer with a specific gap kept between the grooves, to form a stripe-like ridge between the grooves and to expose the first cladding layer from the bottoms of the first grooves; a second growth step of growing a second active layer for forming a saturable absorption region on the first cladding layer exposed in the first grooves, the second active layer having a composition different from that of the first active layer, and growing a current constriction layer for forming a current constriction means; a second groove formation step of forming second grooves on both sides of the ridge with specific distances kept between the second grooves and the ridge, to expose the first cladding layer from the bottoms of the second grooves; and a third growth step of growing a third active layer for forming an outside region on the first cladding layer exposed in the second grooves, the third active layer having a composition different from those of the first and second active layers for forming the gain region and the saturable absorption region, and growing a current constriction layer for forming the current constriction means. In this method, effective band gaps $Eg_1$, $Eg_2$ and $Eg_3$ of the gain region, saturable absorption region and outside region, respectively, are selected to satisfy an inequality of $Eg_1 \geq Eg_2 > Eg_3$.

A second method of producing a semiconductor laser according to the present invention, includes: a first growth step of sequentially growing, on a substrate, a first cladding layer, an active layer having an effective band gap which is uniform in a first direction and which becomes smaller from the center to both sides of the active layer in a second direction perpendicular to the first direction, and a second cladding layer, to form a stacked semiconductor layer; a groove formation step of forming stripe-like grooves spaced from each other at a specific gap in the stacked semiconductor layer in such a manner as to leave a portion, having a large effective band gap, of the active layer in a stripe between the grooves and to leave a portion, having a specific thickness, of the second cladding layer on the bottoms of the grooves; and a second growth step of growing, in the grooves, a current constriction layer, which forms a current constriction means for defining a current injection region at the stripe portion, having the large effective band gap,.of the active layer.

A third method of producing a semiconductor laser according to the present invention, includes: a growth step of sequentially growing, on a substrate, a first cladding layer, an active layer having an effective band gap which is uniform in a first direction and which becomes smaller from the center to both sides of the active layer in a second direction perpendicular to the first direction, and a second cladding layer, to form a stacked semiconductor layer; and a current constriction layer formation step of implanting ions of an impurity in side portions, each having a small effective band gap, on both sides of a stripe portion, having a large effective band gap, of the active layer, to form a current constriction layer which forms a current constriction means for defining a current injection region at the stripe portion, having the large effective band gap, of the active layer.

A fourth method of producing a semiconductor laser according to the present invention, includes: a first growth step of growing, on a substrate, a first cladding layer, an active layer, a second cladding layer, and a saturable absorption layer which is positioned at least one of the first and second cladding layers and which forms a saturable absorption region, to form a stacked semiconductor layer; a groove formation step of forming, in part of the stacked semiconductor layer, stripe-like grooves spaced from each other at a specific gap to a depth crossing the saturable absorption layer for forming a stripe-like ridge; and a second growth step of growing, in the grooves, a saturable absorption layer for forming a current constriction layer which forms, at least on both sides of the ridge, a current constriction means for defining a current injection region in the active layer, and for forming an outside region which is in contact with the saturable absorption layer and which has an effective band gap smaller than that of the saturable absorption layer.

A fifth method of producing a semiconductor laser according to the present invention, includes: a first growth step of growing, on a substrate, a first cladding layer, an active layer, a second cladding layer, and a saturable absorption layer positioned in at least one of the first and second cladding layers and having an effective band gap which is uniform in a first direction and which becomes smaller from the center to both sides of the saturable absorption layer in a second direction perpendicular to the first direction, to form a stacked semiconductor layer; a groove formation step of forming stripe-like grooves spaced from each other at a specific gap in the stacked semiconductor layer to such a depth as to leave a portion, having a large effective band gap, of the saturable absorption layer in a stripe between the grooves and to leave part of the saturable absorption layer and a portion, having a specific thickness, of the second cladding layer; and a second growth step of growing, in the grooves, a current constriction layer, which forms a current constriction means for defining a current injection region in the active layer, on both sides of the ridge.

A sixth method of producing a semiconductor laser according to the present invention, includes: a growth step of growing, on a substrate, a first cladding layer, an active layer, a second cladding layer, and a saturable absorption layer positioned in at least one of the first and second cladding layers and having an effective band gap which is uniform in a first direction and which becomes smaller from the center to both sides of the saturable absorption layer in a second direction perpendicular to the first direction, to form a stacked semiconductor layer; an impurity implantation step of implanting ions of an impurity in a portion, having a small effective band gap, of the saturable absorption layer of the stacked semiconductor layer, to form a current constriction layer which forms a current constriction means for defining a current injection region in the active layer.

First Embodiment

FIG. 1 is a schematic sectional view taken on a plane perpendicular to a resonator length direction, showing a semiconductor laser according to a first embodiment of the present invention. The semiconductor laser in this embodiment has an active layer of a DH (Double Hetero) structure.

Referring to FIG. 1, the semiconductor laser in this embodiment includes a substrate 21 of a first conduction type (n-type in this embodiment), and layers sequentially formed on the substrate 21: a first cladding layer 22 having the same conduction type as that of the substrate 21, an active layer 23, and a second cladding layer 24 having a second conduction type (p-type in this embodiment). Grooves 28 are provided in the second cladding layer 24, so that a stripe-like ridge 27 extending in the direction perpendicular to the paper plane of FIG. 1 is formed as part of the second cladding layer 24 in such a manner as to be held between the grooves 28. A current constriction layer 26 constituting a current constriction means for defining a current injection region in the active layer 23 is buried in each groove 28. A p-type contact layer 25 is formed over the entire surface to cover the upper surface of the ridge 27 as part of the cladding layer 24.

A first electrode 29 is formed on the contact layer 25 in such a manner as to be in ohmic-contact therewith, and a second electrode 30 is formed on the back surface of the substrate 21 in such a manner as to be in ohmic-contact therewith.

The substrate 21 is configured as an n-type GaAs substrate.

The first cladding layer 22 is configured as an n-type type $Al_{0.5}Ga_{0.5}As$ layer, and the second cladding layer 24 is configured as a p-type $Al_{0.5}Ga_{0.5}As$ layer.

The thickness of the first cladding layer 22 is in a range of 0.5 µm to 3 µm, and the dose of an impurity doped in the first cladding layer 22 is in a range of $2 \times 10^{16}$ pieces/cm$^3$ to $3 \times 10^{18}$ pieces/cm$^3$.

With respect to the second cladding layer 24, the thickness of the portion inside the ridge 27 is in a range of 0.5 µm to 3 µm, and the thickness "d" of the portion outside the ridge 27 is in a range of 0.1 µm to 1 µm; and the dose of an impurity doped in the second cladding layer 24 is in a range of $2 \times 10^{16}$ pieces/cm$^3$ to $3 \times 10^{18}$ pieces/cm$^3$.

The contact layer 25 is configured as a p-type GaAs layer. The thickness of the contact layer 25 is in a range of 0.01 µm to 1 µm, and the dose of an impurity doped in the contact layer 25 is in a range of $5 \times 10^{17}$ pieces/cm$^3$ to $3 \times 10^{18}$ pieces/cm$^3$.

The current constriction layer 26 is configured as an n-type GaAs layer. The thickness of the current constriction layer 26 is in a range of 0.3 µm to 3 µm, and the dose of an impurity doped in the current constriction layer 26 is selected at a such a value as to be $1 \times 10^{16}$ pieces/cm$^3$ or more and to allow the current constriction layer 26 to sufficiently achieve the current constriction effect to the ridge 27.

The active layer 23 of the DH structure is configured as an AlGaAs layer. The thickness of the active layer 23 is set at 0.1 µm. To be more specific, with respect to the active layer 23, a portion forming a gain region 231 under the ridge 27 is configured as an $Al_{x1}Ga_{1-x1}As$ layer; portions forming saturable absorption regions 232 outside the gain region 231 are configured as an $Al_{x2}Ga_{1-x2}As$ layer; and portions forming outside regions 233 outside the saturable absorption regions 232 are configured as an $Al_{x3}Ga_{1-x3}As$ layer, where $x_1$, $x_2$ and $x_3$ each representing the component ratio (atomic ratio) of Al satisfy an inequality of $x_1 \geq x_2 > x_3$, preferably, $x_1 > x_2 > x_3$.

Here the Al component ratio $x_1$ in the gain region 231 substantially determines the oscillation wavelength of the semiconductor laser. Assuming $x_1=0.15$, the oscillation wavelength of the semiconductor laser becomes about 770 nm.

In this case, the Al component ratio $x_2$ in the saturable absorption region 232 and the Al component ratio $x_3$ in the outside region 233 are selected to satisfy an inequality of $0.15 \geq x_2 > x_3 \geq 0$, preferably, $0.15 > x_2 > x_3 \geq 0$, for example, selected at $x_2=0.1$ and $x_3=0$.

The width W of the gain region 231 is specified depending on the width of the ridge 27, and selected in a range of 5 µm or less, preferably, 1 µm to 3 µm.

The width Ws of the saturable absorption region 232 is specified depending on a width in which a laser light distribution shown by a chain line "a" is present. The above width, in which the laser light distribution is present, is determined by the width W of the ridge 27, the thickness "d" of the cladding layer 24 under the current constriction layer 26, the Al component ratio $x_1$ and the thickness of the gain region 231, and the Al component ratio $x_2$ and the thickness of the saturable absorption region 232. The width Ws is selected at a value in a range of about 1 µm to about 3 µm.

A method of producing the semiconductor laser having the structure shown in FIG. 1 will be described below.

The above semiconductor laser can be produced, for example, in accordance with the above-described first production method of the present invention. Here, one embodiment of the first production method applied to production of the above semiconductor laser will be described.

Figure 2:
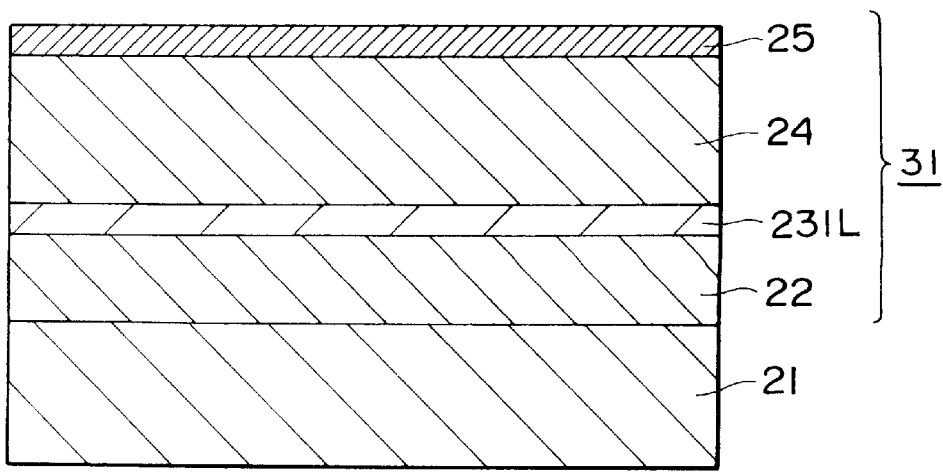
FIGS. 2 to 6 are views showing sequential steps of producing a semiconductor laser according to one embodiment of the present invention.

At a first epitaxial growth step shown in FIG. 2, a first cladding layer 22 made from n-type AlGaAs, an active layer 231L made from $Al_{x1}Ga_{1-x1}As$ for forming a gain region, a second cladding layer 24 made from p-type AlGaAs, and a contact layer 25 made from P-type GaAs are sequentially formed on a substrate 21 made from n-type GaAs by a MOCVD (Metalorganic Chemical Vapor Deposition) method, MBE (Molecular Beam Epitaxy) method, or LPE (Liquid Phase Epitaxy) method.

Figure 3:
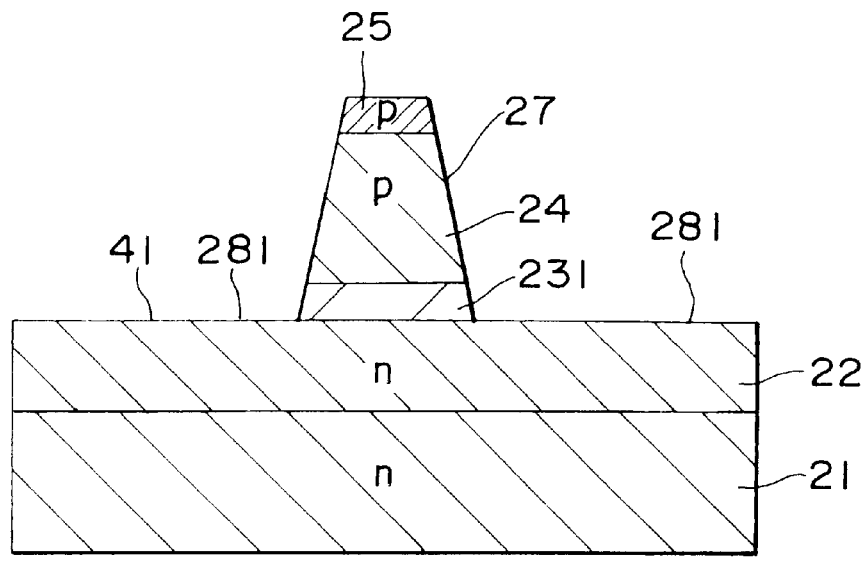

At a first groove formation step shown in FIG. 3, the contact layer 25, the second layer 24, and the active layer 231L are selectively etched from the contact layer 25 side to such a depth as to expose the first cladding layer 22, to form a pair of opposed first grooves 281 and also form, between the grooves 281, a stripe-like ridge 27 extending in the direction perpendicular to the paper plane of FIG. 3. The gap between the grooves 281 is selected at a value corresponding to the above-described width W. The remaining portion of the active layer 231L constitutes a gain region 231.

Figure 4:
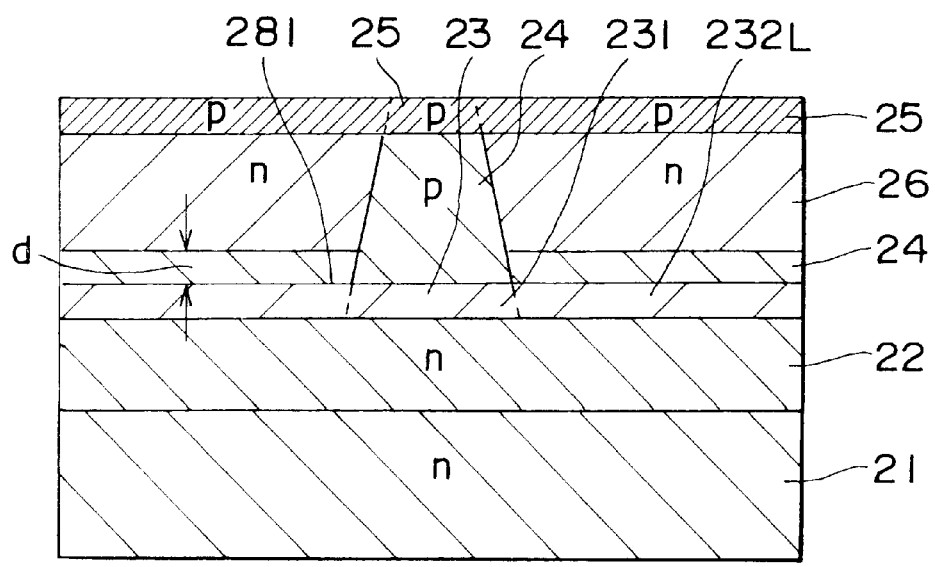

At a second epitaxial growth step shown in FIG. 4, a saturable absorption layer 232L made from $Al_{x2}Ga_{1-x2}As$ for forming saturable absorption regions and having the same thickness as that of the active layer 231, a second cladding layer 24 made from p-type AlGaAs and having a thickness "d", a current constriction layer 26 made from n-type GaAs, and a contact layer 25 made from p-type GaAs are epitaxially grown in sequence on the portion of the first cladding layer 22 exposed in the first grooves 281 by the MOCVD method, MBE method or LPE method.

Figure 5:
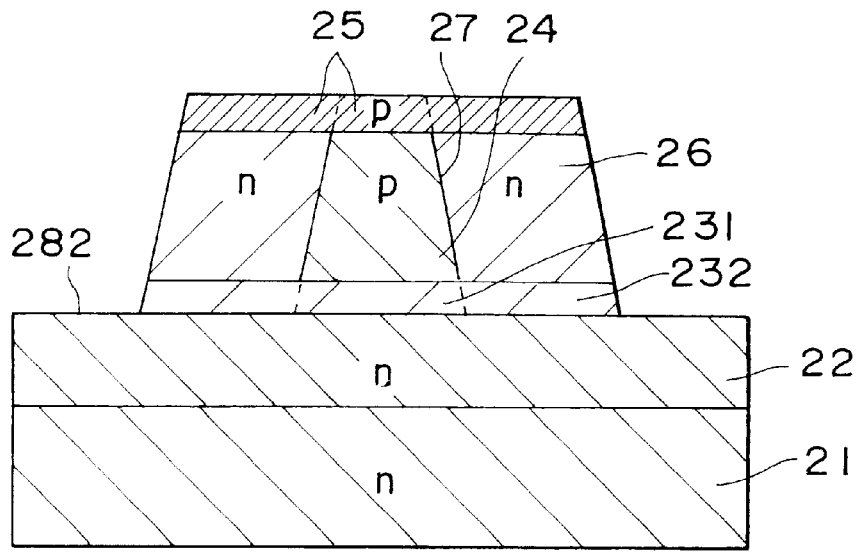

At a second groove formation step shown in FIG. 5, the stacked layers 25, 26, 24 and 232L are selectively etched from the contact layer 25 side to such a depth as to expose the first cladding layer 22, to form second grooves 282 for forming outside regions 233 shown in FIG. 1. The remaining portions of the saturable absorption layer 232L constitute saturable absorption regions 232.

Figure 6:
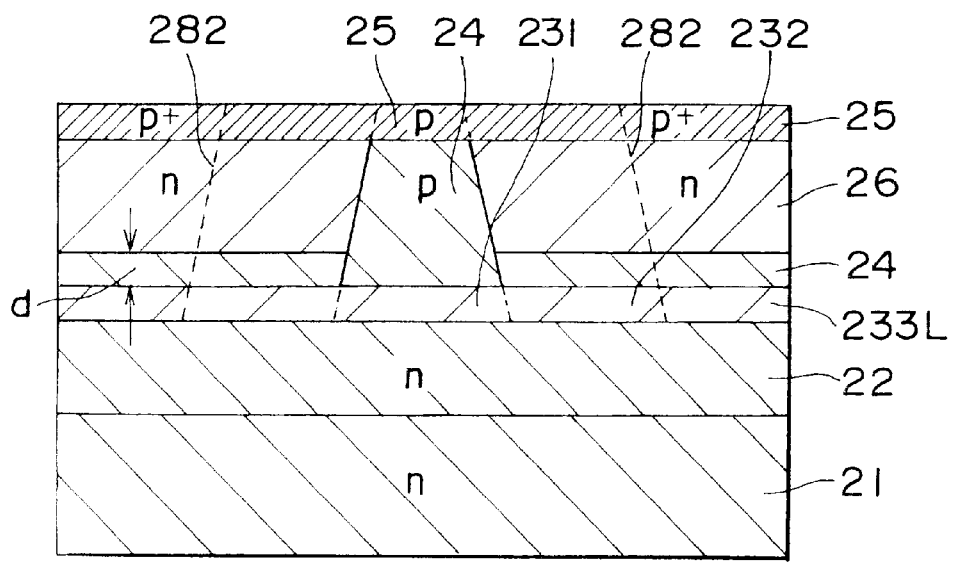

At a third epitaxial growth step shown in FIG. 6, an active layer 233L made from $Al_{x3}Ga_{1-x3}As$ for forming the outside regions 233, a second cladding layer 24 made from AlGaAs and having the thickness "d", a current constriction layer 26 made from n-type GaAs, and a contact layer 25 made from p-type GaAs are epitaxially grown in sequence on the portion of the first cladding layer 22 exposed in the second grooves 282 by the MOCVD method, MBE methods or LPE method.

Finally, a first electrode 29 formed of a Cr layer or TiPt layer is deposited as an ohmic electrode on the contact layer 25, and a second electrode 30 formed of an Au layer is deposited as an ohmic electrode on the back surface of the substrate 21. In this way, the semiconductor laser of the present invention having the configuration shown in FIG. 1 is obtained.

The semiconductor laser configured as described above has the DH structure, in which the Al component ratio $x_2$ in the saturable absorption region 232 is larger than the Al component ratio $x_3$ in the outside region 233 ($x_2 > x_3$), so that the band gap in the saturable absorption region 232 is selected to be larger than the band gap of the outside region 233. With this configuration, because of a property of carriers easy to migrate from a region having a large band gap to a region having a small band gap, carriers generated in the saturable absorption region 232 due to optical absorption readily migrate to the outside region 233, with a result that the effective carrier lifetime in the saturable absorption region 232 is shortened. Accordingly, the ability of the saturable absorption region 232 is enhanced, to allow self pulsation to be sustained at a high optical output and/or at a high operational temperature. As a result, the allowable range of the width W of the gain region 231 or the thickness "d" of the second cladding layer 24 under the current constriction layer 26 can be made large. This makes it possible to facilitate the production of the semiconductor laser and hence to improve the production yield of the semiconductor laser.

Further, in the case where the Al component ratio $x_1$ in the gain region 231 is set to be larger than the Al component ratio $x_2$ in the saturable absorption region 232 ($x_1 > x_2$), the differential gain of the saturable absorption region 232 can be made larger than the differential gain of the gain region 231. As a result, self pulsation can be sustained at a higher optical output and/or a higher operational temperature, so that the allowable range of the width W of the gain region 231 and the thickness "d" of the second cladding layer 24 under the current constriction layer 26 can be made larger.

In the semiconductor laser and the production method thereof according to the present invention, described with reference to FIG. 1 and FIGS. 2 to 6, the active layer is configured as that having the DH structure; however, the active layer may be configured as that having a quantum well structure, for example, a single quantum well structure or a multiple quantum well structure.

In this case, with respect to an Al component ratio x of an $Al_xGa_{1-x}As$ quantum well layer for forming a quantum well structure, assuming that the Al component ratio x in a gain region 231 is taken as $x_1$; the Al component ratio x in a saturable absorption region 232 is taken as $x_2$; and the Al component ratio x in an outside region 233 is taken as $X_3$, by specifying the ratios $x_1$, $x_2$ and $x_3$ such that $x_1$, $x_2$ and $x_3$ satisfy an inequality of $x_1 \geq x_2 > X_3$, preferably, $x_1 > x_2 > x_3$, the same effect as that of the semiconductor laser shown in FIG. 1 can be obtained.

The active layer 23 can be also configured as that having a quantum wire or quantum dot structure of a single or a plurality of quantum wires or quantum dots.

In this case, with respect to an Al component ratio x of the quantum wire or quantum dot structure, assuming that the Al component ratio x in a gain region 231 of the quantum wire or quantum dot structure is taken as $x_1$; the Al component ratio x in a saturable absorption region 232 thereof is taken as $x_2$; and the Al component ratio x in an outside region 233 thereof is taken as $x_3$, by specifying the ratios $x_1$, $x_2$ and $x_3$ such that $x_1$, $x_2$ and $x_3$ satisfy an inequality of $x_1 \geq x_2 > x_3$, preferably, $x_1 > x_2 > x_3$, the same effect as that of the semiconductor laser shown in FIG. 1 can be obtained.

In the active layer 23 having the quantum wire structure, if at least one or all of the quantum wires constituting the quantum wire structure are formed in such a manner as to cross the saturable absorption region 232 and the outside region 233, carriers generated in the saturable absorption region 232 due to optical absorption are allowed to more readily migrate to the outside region 233. With this configuration, the above-described effect can be more enhanced.

The semiconductor laser having the quantum well structure, quantum wire structure or quantum dot structure according to the present invention can be produced in accordance with a method corresponding to that shown in FIGS. 2 to 6. To be more specific, each of the active layers 231L to 233L may be formed in such a manner as to have the quantum well structure, quantum wire structure, or quantum dot structure by the MOCVD method, MBE method, or LPE method in accordance with the production method shown in FIGS. 2 to 6.

Second Embodiment

Figure 7:
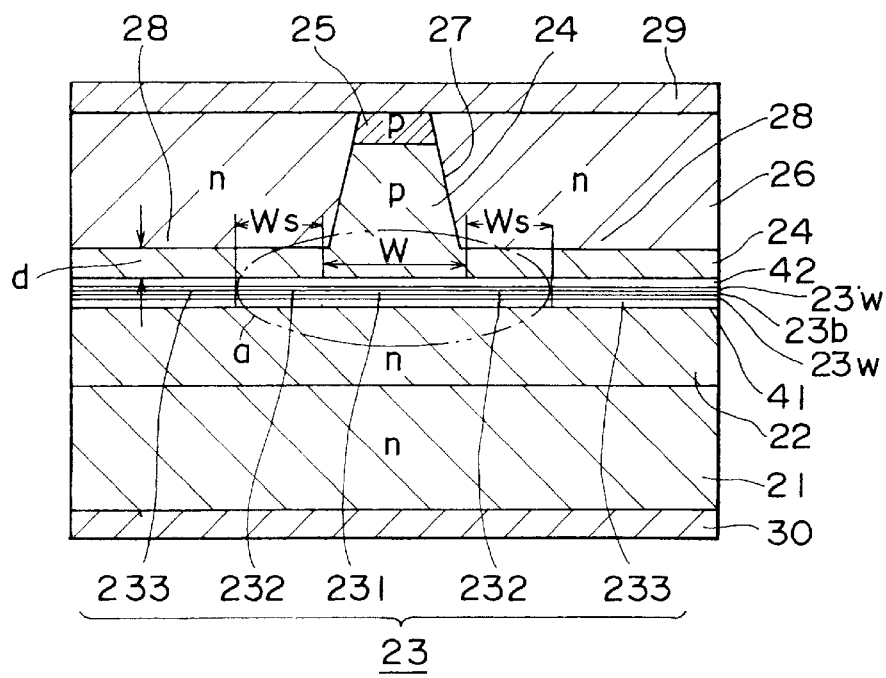
FIG. 7 is a schematic sectional view of a semiconductor laser according to another embodiment of the present invention.

FIG. 7 is a schematic sectional view showing a second embodiment having a multiple quantum well (MQW) structure. In this figure, parts corresponding to those shown in FIG. 1 are designated by the same reference numerals and the overlapped explanation is omitted. In this embodiment, the composition and thickness of each of layers other than the active layer may be the same as those in the first embodiment described with reference to FIG. 1. The active layer 23 in this embodiment has a SCH (Separate Confinement Heterostructure)-MQW structure in which a first light confinement layer 41 is disposed on a first cladding layer 22 side and a second light confinement layer 42 is disposed on a second cladding layer 24 side.

To be more specific, the active layer has the SCH-MQW structure in which the active layer is composed of a plurality of quantum well layers 23w, between two adjacent layers of which a quantum barrier layer 23b is disposed, and the first light confinement layer 41 is disposed adjacent to the first cladding layer 22 and the second light confinement layer 42 is disposed adjacent to the second cladding layer 24. Each of the first and second light confinement layers 41 and 42 and the quantum barrier layer 23b is made from $Al_{0.35}Ga_{0.65}As$, and the quantum well layer 23w is made from $Al_{0.1}Ga_{0.9}As$.

Figures 8A, 8B, 8C:
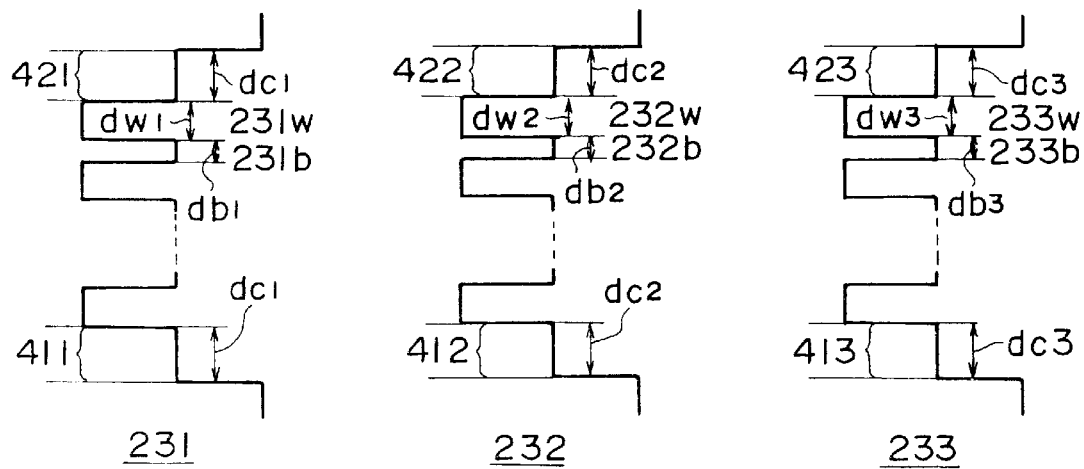
FIGS. 8A to 8C are diagrams showing band models of the semiconductor laser shown in FIG. 7.

FIGS. 8A, 8B and 8C show band model diagrams of forbidden bands on the conduction band side in the gain region 231, saturable absorption regions 232 outside the gain region 231, and the outside regions 233 outside the saturable absorption regions 232, respectively.

Assuming that the thickness of each of semiconductor layers 411 and 421 constituting the first and second light confinement layers 41 and 42 in a gain region 231 is taken as $d_{c1}$; the thickness of each of semiconductor layers 412 and 422 constituting the first and second light confinement layers 41 and 42 in a saturable absorption region 232 is taken as $d_{c2}$; the thickness of each of semiconductor layers 413 and 423 constituting the first and second light confinement layers 41 and 42 in an outside region 233 is taken as $d_{c3}$; the thicknesses of quantum well layers 231w, 232w and 233w in the regions 231, 232 and 233 are taken as $d_{w1}$, $d_{w2}$ and $d_{w3}$, respectively; and the thicknesses of quantum barrier layers 231b, 232b and 233b in the regions 231, 232 and 233 are taken as $d_{b1}$, $d_{b2}$ and $d_{b3}$, respectively, the thicknesses $d_{w1}$, $d_{w2}$ and $d_{w3}$ are selected to satisfy an inequality of $d_{w1} \leq d_{w2} < d_{w3}$, preferably, $d_{w1} < d_{w2} < d_{w3}$, for example $d_{w1} = 100$ Å, $d_{w2} = 110$ Å, $d_{w3} = 130$ Å; the thicknesses $d_{b1}$, $d_{b2}$ and $d_{b3}$ are selected to satisfy an inequality of $d_{b1} \geq d_{b2} > d_{b3}$, preferably, $d_{b1} \geq d_{b2} > d_{b3}$, for example, $d_{b1} = d_{b2} = d_{b3} =$ about 80 Å; and the thicknesses $d_{c1}$, $d_{c2}$, and $d_{c3}$ are selected at about 500 Å.

The number of the quantum wells is selected to be in a range of 2 to about 10.

The effective band gap in the MQW structure is specified depending on the band gap determined by the composition of the quantum well layer and the thickness of the quantum well layer, and the band gap determined by the composition of the quantum barrier layer and the thickness of the quantum barrier layer. In the case of changing the thickness of the quantum well layer, if the thickness becomes larger, the energy of the quantum level formed in the quantum well becomes lower, with a result that the effective band gap becomes smaller.

Accordingly, in the active layer having the SCH-MQW structure in the second embodiment, letting the effective band gaps in the gain region 231, saturable absorption region 232 and outside region 233 be $Eg_1$, $Eg_2$, and $Eg_3$, respectively, there is given an inequality of $Eg_1 \geq Eg_2 > Eg_3$ or $Eg_1 > Eg_2 > Eg_3$.

The semiconductor laser including the active layer having the SCH-MQW structure can be produced in accordance with a method basically similar to that described with reference to FIGS. 2 to 6. To be more specific, in formation of films by epitaxial growth for forming the gain region 231, saturable absorption region 232 and the outside region 233 of the active layer 23 in accordance with the method shown in FIGS. 2 to 6, each film is configured to have the SCH-MQW structure.

In the semiconductor laser according to this embodiment, since the thickness $d_{w2}$ of the quantum well layer 232w having the SCH-MQW structure in the saturable absorption region 232 is set to be thinner than the thickness of $d_{w3}$ of the quantum well layer 233w having the SCH-MQW structure in the outside region 233, the effective band gap of the MQW structure in the saturable absorption region 232 becomes larger than the effective band gap in the outside region 233. Accordingly, because of a property of carriers easy to migrate from a region having a large effective band gap to a region having a small effective band gap, carriers generated in the saturable absorption region 232 due to optical absorption readily migrate to the outside region 233, so that the effective carrier lifetime in the saturable absorption region 232 is shortened. As a result, the ability of the saturable absorption region 232 is enhanced, to thereby allow self pulsation to be sustained at a high optical output and/or at a high operational temperature. Accordingly, the allowable range of the width W of the gain region 231 or the thickness "d" of the second cladding layer 24 under the current constriction layer 26 can be made large.

Further, in the case where the thickness $d_{w1}$ of the quantum well layer 231w having the SCH-MQW structure in the gain region 231 is set to be smaller than the thickness $d_{w2}$ of the quantum well layer 232w having the SCH-MQW structure in the saturable absorption region 232 ($d_{w1} < d_{w2}$), the differential gain of the saturable absorption region 232 can be made larger than the differential gain of the gain region 231. As a result, self pulsation can be sustained at a higher optical output and/or a higher operational temperature, so that the allowable range of the width W of the gain region 231 and the thickness "d" of the second cladding layer 24 under the current constriction layer 26 can be made larger.

In the second embodiment, the present invention can be applied to the semiconductor laser including the active layer having a so-called SQW (Single Quantum Well) structure, in addition to the above-described semiconductor laser including the active layer having the MQW structure.

In this case, the active layer 23 has the SQW structure that the active layer 23 is composed of a single quantum well 23w with no quantum barrier layer, unlike the MQW structure, and the first light confinement layer 41 is disposed adjacent to the first cladding layer 22 and the second light confinement layer 42 is disposed adjacent to the second cladding layer 24.

Like the MQW structure, letting the thickness of the quantum well layer 231w in the gain region 231 be $d_{w1}$, the thickness of the quantum well layer 232w in the saturable absorption region 232 be $d_{w2}$, and the thickness of the quantum well layer 233w in the outside region 233 be $d_{w3}$, the thicknesses $d_{w1}$, $d_{w2}$ and $d_{w3}$ are specified to satisfy an inequality of $d_{w1} \leq d_{w2} < d_{w3}$, preferably, $d_{w1} < d_{w2} < d_{w3}$, for example, $d_{w1} = 100$ Å, $d_{w2} = 110$ Å, and $d_{w3} = 130$ Å.

The semiconductor laser having the SQW structure can be produced basically in accordance with the above-described production method for the semiconductor laser having the MQW structure. To be more specific, in formation of films for forming the gain region 231, saturable absorption region 232 and the outside region 233 of the active layer 23, each film is formed to have the SQW structure in place of the MQW structure. That is to say, in formation of the films for forming the gain region 231, saturable absorption region 232 and the outside region 233, each film may be formed of the single quantum well layer 23w with no barrier layer.

The effective band gap in the SQW structure is specified depending on the band gap determined by the composition of the quantum well layer and the thickness of the quantum well layer. In the case of changing the thickness of the quantum well layer, if the thickness becomes larger, the energy of the quantum level formed in the quantum well becomes lower, with a result that the effective band gap becomes smaller.

Accordingly, in the active layer having the SCH-SQW structure, like the SCH-MQW structure, the effective band gaps $Eg_1$, $Eg_2$ and $Eg_3$ in the gain region 231, saturable absorption region 232 and outside region 233 satisfy an inequality of $Eg_1 \geq Eg_2 > Eg_3$ or $Eg_1 > Eg_2 > Eg_3$, so that the same effect as that obtained by the SCH-MQW structure can be obtained.

In this embodiment, the above-described quantum well structure may be configured as a quantum wire or quantum dot structure.

In this case, the active layer 23 may be formed of semiconductor layers having the quantum wire or quantum dot structure, which are formed by burying quantum wires or quantum dots in place of the quantum well layers 23w having the SCH-MQW structure. The other configuration may be the same as that of the SCH-MQW structure.

The active layer 23 may be also configured as a single semiconductor layer having the quantum wire or quantum dot structure, in place of the quantum well layer having the SQW structure.

Letting the thicknesses of the quantum wires or the average sizes (volumes) of the quantum dots in the gain region 231, saturable absorption region 232 and the outside region 233 be $d_{w1}$, $d_{w2}$ and $d_{w3}$, respectively, there is given an inequality of $d_{w1} \leq d_{w2} < d_{w3}$, preferably, $d_{w1} < d_{w2} < d_{w3}$.

The semiconductor laser having the quantum wire structure or the quantum dot structure can be produced in accordance with a method substantially similar to the production method for the semiconductor laser having the SCH-MQW structure. To be more specific, in formation of films by epitaxial growth for forming the gain region 231, saturable absorption region 232 and the outside region 233 of the active layer 23, each film may be formed of the semiconductor layers having the quantum wire or the quantum dot structure in place of the quantum well layers having the SCH-MQW structure.

In the semiconductor laser having the quantum wire or quantum dot structure, as the thickness of the quantum wire or the size (volume) of the quantum dot becomes larger, the energy of the quantum level of the quantum wire or the quantum dot becomes lower, with a result that the effective band gap in the quantum wire or quantum dot structure becomes smaller. Accordingly, in the case where the thicknesses $d_{w1}$, $d_{w2}$ and $d_{w3}$ of the quantum wires or the average sizes (volumes) $d_{w1}$, $d_{w2}$ and $d_{w3}$ of the quantum dots in the gain region 231, saturable absorption region 232 and the outside region 233, respectively are specified to satisfy an inequality of $d_{w1} \leq d_{w2} < d_{w3}$, preferably, $d_{w1} < d_{w2} < d_{w3}$, as described above, the effective band gaps $Eg_1$, $Eg_2$ and $Eg_3$ in the gain region 231, saturable absorption region 232 and the outside region 233 satisfy, like the SCH-MQW structure, an inequality of $Eg_1 \geq Eg_2 > Eg_3$ or $Eg_1 > Eg_2 > Eg_3$.

As a result, even in the case of the semiconductor laser including the active layer having the quantum wire or quantum dot structure, the same effect as that described above can be obtained.

In the active layer having the quantum wire structure, if at least one or all of the quantum wires constituting the quantum wire structure are formed in such a manner as to cross the saturable absorption region 232 and the outside region 233, carriers generated in the saturable absorption region 232 due to optical absorption are allowed to more readily migrate to the outside region 233. With this configuration, the above-described effect can be more enhanced.

Third Embodiment

In this embodiment, the present invention is applied, like the second embodiment, to a semiconductor laser having a SCH-MQW structure substantially similar to the SCH-MQW structure described with reference to FIGS. 7 and 8A to 8C. In this embodiment, however, assuming that the thicknesses of quantum well layers 231w, 232w and 233w in a gain region 231, a saturable absorption region 232 and an outside region 233 are taken as $d_{w1}$, $d_{w2}$ and $d_{w3}$, respectively; the thicknesses of quantum barrier layers 231b, 232b and 233b in the regions 231, 232 and 233 are taken as $d_{b1}$, $d_{b2}$ and $d_{b3}$, respectively; and the thickness of each of first and second light confinement layers 411 and 421 in the gain region 231 is taken as $d_{c1}$, the thickness of each of the first and second light confinement layers 412 and 422 in the saturable absorption region 232 is taken as $d_{c2}$, and the thickness of each of first and second light confinement layers 413 and 423 in the outside region 233 is taken as $d_{c3}$, the thicknesses $d_{w1}$, $d_{w2}$ and $d_{w3}$ are selected at $d_{w1} = d_{w2} = d_{w3} =$ about 100 Å; the thicknesses $d_{b1}$, $d_{b2}$ and $d_{b3}$ are selected to satisfy an inequality of $d_{b1} \geq d_{b2} > d_{b3}$, preferably, $d_{b1} > d_{b2} > d_{b3}$, for example, $d_{b1} = 80$ Å, $d_{b2} = 70$ Å, and $d_{b3} = 50$ Å; and the thicknesses $d_{c1}$, $d_{c2}$, and $d_{c3}$ are selected at about 500 Å.

In the MQW structure, as the thickness of the quantum barrier layer for separating the quantum well layers from each other becomes thinner, the connection between the quantum well layers becomes stronger, with a result that the energy of the quantum level becomes lower and thereby the effective band gap of the MQW structure becomes smaller. Accordingly, in the case where the thicknesses $d_{b1}$, $d_{b2}$ and $d_{b3}$ of the quantum barrier layers 231b, 232b and 233b in the gain region 231, saturable absorption region 232 and the outside region 233 are specified to satisfy the inequality of $d_{b1} \geq d_{b2} > d_{b3}$, preferably, $d_{b1} > d_{b2} > d_{b3}$ as described above, the effective band gaps $Eg_1$, $Eg_2$ and $Eg_3$ in the gain region 231, saturable absorption region 232 and the outside region 233 satisfy an inequality of $Eg_1 \geq Eg_2 > Eg_3$ or $Eg_1 > Eg_2 > Eg_3$. As a result, the same effect as that described in the second embodiment can be obtained.

The semiconductor laser in this embodiment can be produced in accordance with the same method as that described in the second embodiment.

Fourth Embodiment

In this embodiment, the present invention is applied, like the second embodiment, to a semiconductor or laser having a SCH-MQW structure. With respect to the active layer having the SCH-MQW structure in this embodiment, letting the number of quantum well layers 231w in the gain region 231 be $Nw_1$; the number of quantum well layers 232w in the saturable absorption region 232 be $Nw_2$; and the number of quantum well layers 233w in the outside region 233 be $Nw_3$, the values $Nw_1$, $Nw_2$ and $Nw_3$ are specified to satisfy an inequality of $Nw_1 \leq Nw_2 < Nw_3$, preferably, $Nw_1 < Nw_2 < Nw_3$.

In the MQW structure, as the number of the quantum well layers becomes larger, the two-dimensional characteristic of the MQW structure becomes weaker, with a result that the effective band gap becomes smaller. Accordingly, in the case where the numbers $Nw_1$, $Nw_2$ and $Nw_3$ of the quantum well layers in the gain region 231, saturable absorption region 232 and the outside region 233 are specified to satisfy the inequality of $Nw_1 \leq Nw_2 < Nw_3$, preferably, $Nw_1 < Nw_2 < Nw_3$ as described above, the effective band gaps $Eg_1$, $Eg_2$ and $Eg_3$ in the gain region 231, saturable absorption region 232 and the outside region 233 satisfy an inequality of $Eg_1 \geq Eg_2 > Eg_3$ or $Eg_1 > Eg_2 > Eg_3$.

As a result, even in this embodiment, the same effect as that described in the first, second, and third embodiments can be obtained.

The semiconductor laser having the above-described structure can be produced basically in accordance with the method shown in FIGS. 2 to 6. To be more specific, the active layer composed of quantum well layers and quantum barrier layers, and light confinement layers are epitaxially grown in each of the gain region 231, saturable absorption region 232 and the outside region 233 in such a manner that the number of the quantum well layers are selected to satisfy the above-described relationship.

With respect to the active layer having the SCH-MQW structure in this embodiment, the multiple quantum well (MQW) structure may be replaced with the quantum wire or quantum dot structure.

In this case, the active layer 23 may be formed of semiconductor layers having the quantum wire or quantum dot structure, which are formed by burying quantum wires or quantum dots in place of the quantum well layers 23w having the SCH-MQW structure. The other configuration may be the same as that of the SCH-MQW structure.

The active layer 23 may be also configured as a single semiconductor layer with no quantum barrier layer, having the quantum wire or quantum dot structure.

Assuming that the numbers of the quantum well wires or the number densities of the quantum dots in the gain region 231, saturable absorption region 232 and the outside region 233 are taken as $Nw_1$, $Nw_2$ and $NW_3$, respectively, the values $Nw_1$, $Nw_2$ and $Nw_3$ are specified to satisfy an inequality of $Nw_1 \leq Nw_2 < Nw_3$, preferably, $Nw_1 < Nw_2 < Nw_3$.

The semiconductor laser having the quantum wire or quantum dot structure can be produced in accordance with a method substantially similar to the method for producing the semiconductor laser having the SCH-MQW structure. To be more specific, in formation of films by expitaxial growth for forming the gain region 231, saturable absorption region 232 and the outside region 233 of the active layer 23, each film is formed of the semiconductor layers having the quantum wire or quantum dot structure in place of the quantum well layers having the SCH-MQW structure.

In the semiconductor laser having the quantum wire or quantum dot structure, as the number of quantum wires or the number density of the quantum dots becomes larger, the connection between the quantum wires or between the quantum dots becomes stronger, with a result that the one-dimensional characteristic of the quantum wire structure or the zero-dimensional characteristic of the quantum dot structure becomes weaker and thereby the effective band gap of the quantum wire or quantum dot structure becomes smaller. Accordingly, in the case where the numbers $Nw_1$, $Nw_2$ and $Nw_3$ of the quantum wires or the number densities $Nw_1$, $Nw_2$ and $Nw_3$ of the quantum dots in the gain region 231, saturable absorption region 232 and the outside region 233, respectively are specified to satisfy an inequality of $Nw_1 \leq Nw_2 < Nw_3$, preferably, $Nw_1 < Nw_2 < Nw_3$ as described above, the effective band gaps $Eg_1$, $Eg_2$ and $Eg_3$ in the gain region 231, saturable absorption region 232 and the outside region 233 satisfy, like the active layer having the SCH-MQW structure, an inequality of $Eg_1 \geq Eg_2 > Eg_3$ or $Eg_1 > Eg_2 > Eg_3$.

As a result, even in the semiconductor laser including the active layer having the quantum wire or quantum dot structure, the same effect as that described above can be obtained.

In the active layer 23 having the quantum wire structure, if at least one, preferably, the number $Nw_2$ of the quantum wires are formed in such a manner as to cross the saturable absorption region 232 and the outside region 233, carriers generated in the saturable absorption region 232 due to optical absorption are allowed to more readily migrate to the outside region 233. With this configuration, the above-described effect can be more enhanced.

In the semiconductor laser in each of the above-described embodiments, the active layer is divided into the gain region 231, saturable absorption region 232 and the outside region 233, and the band gaps $Eg_1 Eg_2$ and $Eg_3$ in these regions are specified to satisfy the inequality of $Eg_1 \geq Eg_2 > Eg_3$, preferably, $Eg_1 > Eg_2 > Eg_3$; however, a saturable absorption layer including the saturable absorption region and the outside region may be formed separately from the active layer including the gain region.

The embodiment having such a configuration will be described below.

Fifth Embodiment

Figure 9:
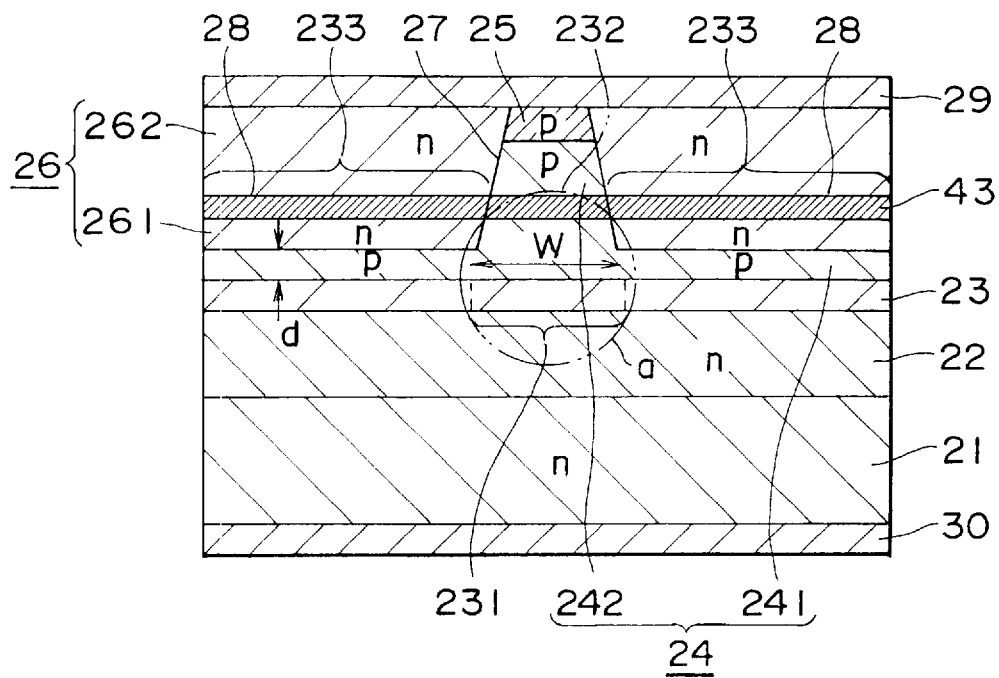
FIG. 9 is a schematic sectional view of a semiconductor laser according to a further embodiment of the present invention.

FIG. 9 is a schematic sectional view of a semiconductor laser having a DH structure. Referring to FIG. 9, the semiconductor laser in this embodiment includes, like the first embodiment shown in FIG. 1, a first cladding layer made from n-type AlGaAs on a substrate 21 made from an n-type GaAs. In this embodiment, an active layer 23 made from $Al_{x1}Ga_{1-x1}$, which includes a gain region 231; a second cladding layer 24 made from a p-type AlGaAs; and a contact layer 25 made from p-type GaAs are formed on the first cladding layer 22. Grooves 28 are provided in the second cladding layer 24, so that a stripe-like ridge 27 having a width W is formed as part of the second cladding layer 24 in such a manner as to be held between the grooves 28. A current constriction layer 26 made from n-type $Al_{0.5}Ga_{0.5}As$ for defining a current injection region, that is, a gain region 231 in the active layer 23 is buried in each groove 28.

A saturable absorption layer 43 having a saturable absorption region 232 and outside regions 233 is formed at a position separated from the active layer 23. The saturable absorption region 232 made from $Al_{x2}Ga_{1-x2}As$ is located in the stripe-like ridge 27 in such a manner as to be vertically separated from the active layer 23 with a lower side second cladding layer 241 put therebetween. The outside regions 233 made from $Al_{x3}Ga_{1-x3}As$ are located on both sides of the stripe-like ridge 27, that is, adjacent to both sides of the saturable absorption region 232 in such a manner as to be vertically separated from the active layer 23 with the lower side second cladding layer 241 and a lower side current constriction layer 261 put therebetween.

Each of the active layer 23 and the saturable absorption layer 43 is set at 0.1 μm and has a DH structure.

With respect to the active layer 23 and the saturable absorption layer 43, Al component ratios $x_1$, $x_2$ and $x_3$ in the gain region 231, saturable absorption region 232 and the outside region 233 are specified to satisfy an inequality of $x_1 \geq x_2 > x_3$, preferably, $X_1 > x_2 > x_3$, for example, $x_1 = 0.15$, $x_2 = 0.1$, and $x_3 = 0$.

The semiconductor laser having this structure can be produced in accordance with the above-described fourth production method. One example of producing the semiconductor laser in accordance with the fourth production method will be described below.

Figure 10:
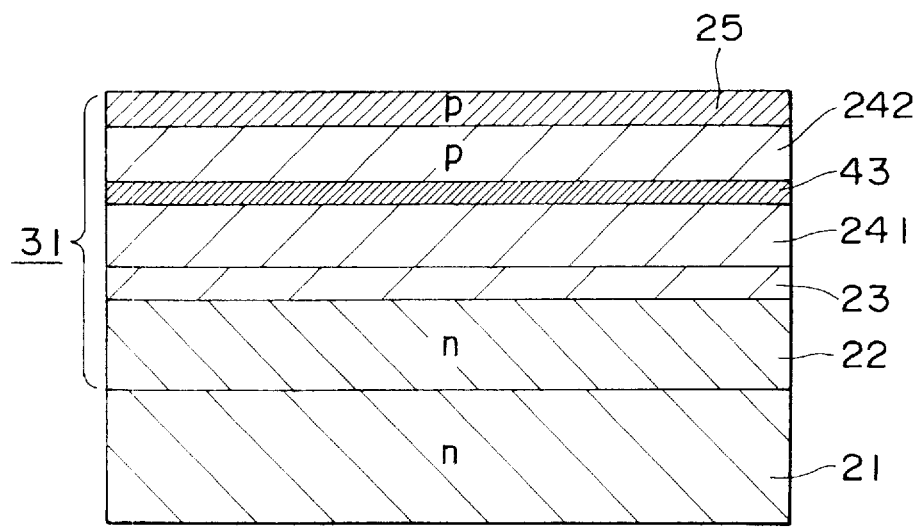
FIGS. 10 and 11 are views showing sequential steps of producing a semiconductor laser according to another embodiment of the present invention.

Referring to FIG. 10, layers are epitaxially grown in sequence on a substrate 21 made from n-type GaAs: a first cladding layer 22 made from n-type $Al_{0.5}Ga_{0.5}As$; an active layer 23 made from $Al_xGa_{1-x}As$ ($x=x_1$) for forming a gain region 231; a lower side second cladding layer 241 made from p-type $Al_{0.5}Ga_{0.5}As$; a saturable absorption layer 43 made from $Al_xGa_{1-x}As$ ($x=x_2$) for forming a saturable absorption region 232; an upper side second cladding layer 242 made from p-type $Al_{0.5}Ga_{0.5}As$, and a contact layer 25 made from p-type GaAs. These layers constitute a stacked semiconductor layer 31.

Figure 11:
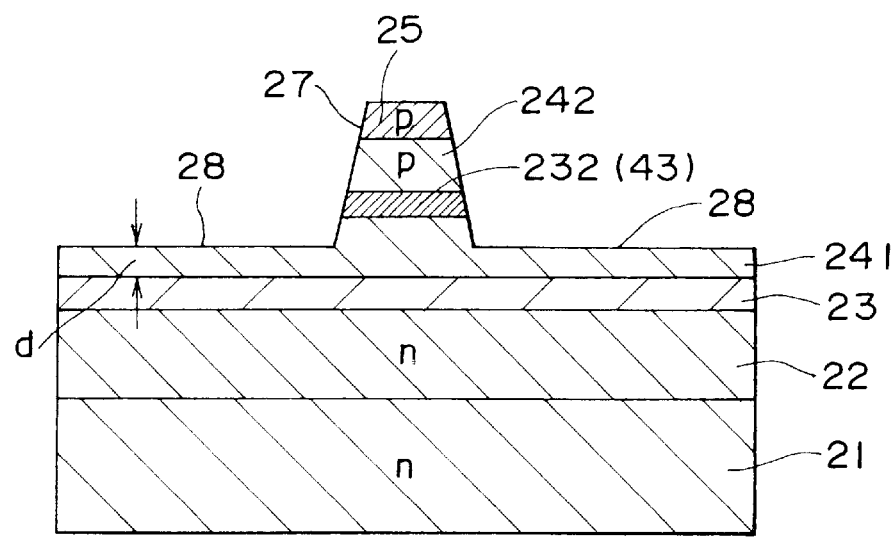

Referring to FIG. 11, the contact layer 25, upper side second cladding layer 242, saturable absorption layer 43, and the lower side second cladding layer 241 are selectively etched from the contact layer 25 side to such a depth that the lower side second cladding layer 241 having a thickness "d" remains, to form a pair of opposed grooves 28 and also form a stripe-like ridge 27 extending in the direction perpendicular to the paper plane of FIG. 11 between the grooves 28. At this time, the saturable absorption region 232 as part of the saturable absorption layer 43 is formed in the ridge 27.

A gap between the grooves 28 is selected at a value corresponding to the above-described width W.

Then, as shown in FIG. 9, a lower side current constriction layer 261 made from n-type $Al_{0.5}Ga_{0.5}As$ is epitaxially grown on the lower side second cladding layer 241 exposed in the grooves 28. A saturable absorption layer 43 made from $Al_xGa_{1-x}As$ ($x=x_3$) for forming an outside region 233 is expitaxilly grown on the lower side current constriction layer 261 in such a manner as to be located on both sides of the saturable absorption region 232 and to be at the same level as that of the saturable absorption region 232. An upper side current constriction layer 262 made from n-type $Al_{0.5}Ga_{0.5}As$ is epitaxially grown on the saturable absorption layer 43.

The expitaxial growth of each of the above-described semiconductor layers can be performed by the MOCVD method, MBE method or LPE method.

A first electrode 29 made from Cr or TiPt is deposited over the contact layer 25 and the upper side current constriction layer 262 in such a manner as to be in ohmic-contact therewith, and a second electrode 30 made from Au is deposited on the back surface of the substrate 21 in such a manner as to be in ohmic-contact therewith.

Even in the semiconductor laser in this embodiment, since the Al component $x_2$ in the saturable absorption region 232 is set to be larger than the Al component $x_3$ in the outside region 233 ($x_2 > x_3$), the band gap in the saturable absorption region 232 is set to be larger than the band gap in the outside region 233. With this configuration, since carriers are easy to migrate from a region having a large band gap to a region having a small band gap as described above, carriers generated in the saturable absorption region 232 due to optical absorption readily migrate to the outside region 233, with a result that the effective carrier lifetime in the saturable absorption region 232 is shortened. Accordingly, the ability of the saturable absorption region 232 is enhanced, to allow self pulsation to be sustained at a high optical output and/or at a high operational temperature.

As a result, the allowable range of the width W of the gain region 231 or the thickness "d" of the lower side second cladding layer 241 under the lower side current constriction layer 261 can be made large. This makes it possible to facilitate the production of the semiconductor laser and hence to improve the production yield of the semiconductor laser.

Further, in the case where the Al component ratio $x_1$ in the gain region 231 is set to be larger than the Al component ratio $x_2$ in the saturable absorption region 232 ($x_1 > x_2$), the differential gain of the saturable absorption region 232 can be made larger than the differential gain of the gain region 231. As a result, self pulsation can be sustained at a higher optical output and/or a higher operational temperature. This makes it possible to further facilitate the production of the semiconductor laser and hence to further improve the production yield of the semiconductor laser.

In the fifth embodiment, as shown in FIGS. 10 and 11, the saturable absorption layer 43 including the saturable absorption region 232 is formed between the lower side second cladding layer 241 and the upper side cladding layer 242; however, the saturable absorption layer 43 may be formed in the first cladding layer 22 or the second cladding layer 24 in such a manner as to be separated from the active layer 23. Even in this case, portions, at which light effusion occurs due to light emission in the gain region 231, of the saturable absorption layer 43 are taken as the saturable absorption regions 232 and portions, at which light effusion little occurs, located outside the saturable absorption regions 232 are taken as the outside regions 233.

The semiconductor laser having the above configuration can be produced basically in accordance with the method described above. Even in this case, all semiconductor layers are epitaxially grown once in a specific order, and thereafter, grooves 28 are formed to a position crossing the saturable absorption layer and a saturable absorption layer for forming outside regions 233 is formed again.

The gain region 231, saturable absorption region 232 and the outside region 233 are each configured as that having the DH structure in the fifth embodiment; however, either or each of them may be configured as that having a quantum well structure. In this case, with respect to the structure and its production method shown in FIGS. 9 to 11, either or each of the active layer 23 and the saturable absorption layer 43 having the DH structure may be replaced with that having the quantum well structure.

Further, the quantum well structure may be replaced with a quantum wire or quantum dot structure.

In the case of forming the saturable absorption layer 43 having the quantum well structure, Al component ratios $x_2$ and $x_3$ of quantum well layers in the saturable absorption region 232 and the outside region 233 are specified as $x_2 > x_3$ like the fifth embodiment, or thicknesses $d_{w2}$ and $d_{w3}$ of the quantum well layers in both the regions are specified as $d_{w2} < d_{w3}$. In the case of forming the saturable absorption region 43 having the MQW structure, thickness $d_{b2}$ and $d_{b3}$ of quantum barrier layers in both the regions are specified as $d_{b2} < d_{b3}$ like the third embodiment, or the numbers Nw$_2$ and Nw$_3$ of the quantum well layers in both the regions are specified as Nw$_2$ < Nw$_3$. The above configurations may be suitably combined with each other. In each case, the effective band gaps Eg$_2$ and Eg$_3$ of the quantum well structures of the saturable absorption region 232 and outside region 233 satisfy an inequality of Eg$_2$ > Eg$_3$. As a result, the same effect as that described in each of the above-described embodiment can be obtained.

In the case of replacing the quantum well structure with the quantum wire or quantum dot structure, Al component ratios $x_2$ and $x_3$ of quantum wires or quantum dots constituting the quantum wire or quantum dot structures in the saturable absorption region 232 and outside region 233 are specified as $x_2 > x_3$ like the fifth embodiment; thicknesses $d_{w2}$ and $d_{w3}$ of the quantum wires or sizes $d_{w2}$ and $d_{w3}$ of quantum dots in both the regions are specified as $d_{w2} < d_{w3}$ like the second embodiment; or the number Nw$_2$ and Nw$_3$ of the quantum wires or the number densities Nw$_2$ and Nw$_3$ of the quantum dots in both the regions are specified as Nw$_2$ < Nw$_3$ like the fourth embodiment. The above configurations may be suitably combined with each other. In each case, the effective band gaps Eg$_2$ and Eg$_3$ of the quantum wire or quantum dot structures of the saturable absorption region 232 and outside region 233 satisfy an inequality of Eg$_2$ > Eg$_3$. As a result, the same effect as that described in each of the above-described embodiment can be obtained.

Sixth Embodiment

In this embodiment, the present invention is applied, like the second embodiment shown in FIG. 7, to a self pulsation laser having a SCH-MQW structure. An active layer 23 has a gain region 231, a saturable absorption region 232, and an outside region 233. As shown by the band diagrams in FIGS. 8A to 8C, the gain region 231 has quantum well layers 231w, each barrier layer 231b, and first and second light confinement layers 411 and 421 disposed with the quantum well layers 231w and barrier layer 231b put therebetween; the saturable absorption region 232 has quantum well layers 232w, each barrier layer 232b, and first and second light confinement layers 412 and 422 disposed with the quantum well layers 232w and barrier layer 232b put therebetween; and the outside region 233 has quantum well layers 233w, each barrier layer 233b, and first and second light confinement layers 413 and 423 disposed with the quantum well layers 233w and barrier layer 233b put therebetween. The semiconductor laser in this embodiment is characterized in that the thickness of the active layer 23 is smoothly increased from the gain region 231 to the saturable absorption region 232 and is further increased from the saturable absorption region 232 to the outside region 233.

Figure 12:
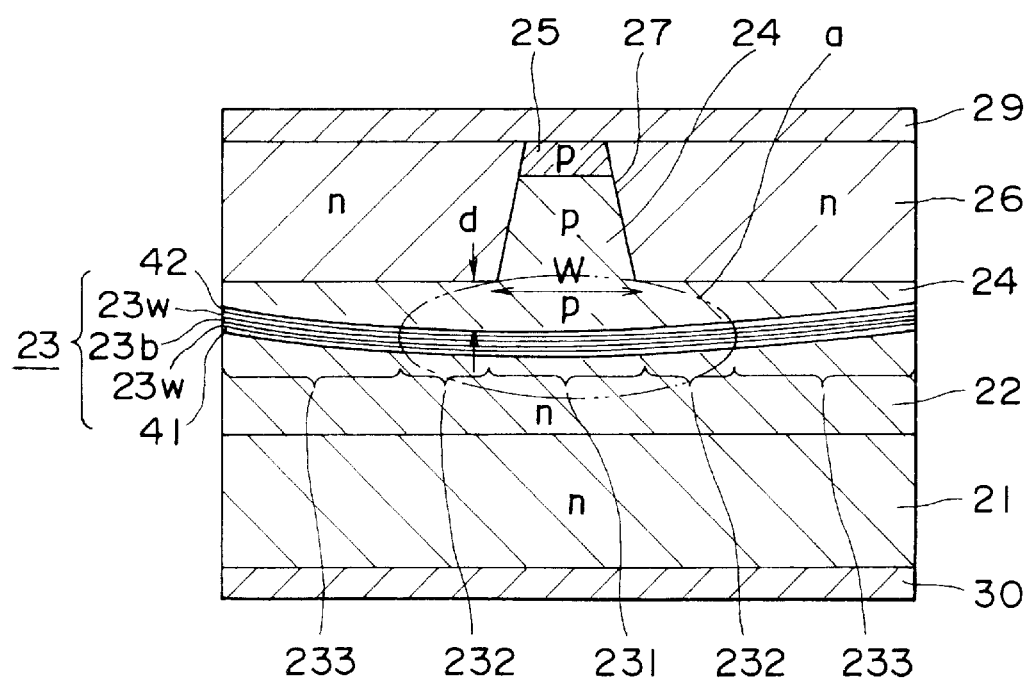
FIG. 12 is a schematic sectional view of a semiconductor laser according to a further embodiment of the present invention.

FIG. 12 is a schematic sectional view of the semiconductor laser according to the sixth embodiment. In the figure, parts corresponding to those shown in FIG. 7 are designated by the same characters. In this embodiment, referring to FIGS. 8A to 8C, letting average thicknesses of quantum well layers 231w, 232w and 233w in the gain region 231, saturable absorption region 232 and outside region 233 be $d_{w1}$, $d_{w2}$ and $d_{w3}$, respectively; average thicknesses of quantum barrier layers 231b, 232b and 233b in the regions 231, 232 and 233 be $d_{b1}$, $d_{b2}$ and $d_{b3}$, respectively; and average thicknesses of each of light confinement layers 411 and 421, each of light confinement layers 412 and 422, and each of light confinement layers 413 and 423 be $d_{c1}$, $d_{c2}$ and $d_{c3}$, the above average thicknesses are specified to satisfy inequalities of $d_{w1} < d_{w2} < d_{w3}$, $d_{b1} < d_{b2} < d_{b3}$, and $d_{c1} < d_{c2} < d_{c3}$ depending on a change in thickness of the active layer 23, for example, $d_{w1}$=100 Å, $d_{w2}$=110 Å, $d_{w3}$=130 Å, $d_{b1}$=50 Å, $d_{b2}$=55 Å, $d_{b3}$=65 Å, $d_{c1}$=400 Å, $d_{c2}$=440 Å and $d_{c3}$=520 Å.

The semiconductor laser can be produced in accordance with the above-described second production method. One example of producing the semiconductor laser in accordance with the second production method will be described below.

In this example, as shown in FIG. 13A, stripe-like masks 61 spaced at specific intervals for performing stripe-like selective epitaxy are formed on one principal plane of a substrate 21 made from n-type GaAs in such a manner as to extend in the direction perpendicular to the paper plane of FIG. 13A. The masks 61, made from $SiO_2$ on which epitaxial growth of a semiconductor layer does not occur, are formed by forming an $SiO_2$ layer over the entire surface by a CVD method, and selectively etching the $SiO_2$ layer into a specific stripe pattern by photolithography.

Layers are sequentially formed on the principal plane of the substrate 21 through gaps between the selective expitaxial growth masks 61: a first cladding layer 22 made from n-type $Al_{0.5}Ga_{0.5}As$; an active layer 23 made from $Al_{0.15}Ga_{0.85}As$; a second cladding layer 24 made from p-type $Al_{0.5}Ga_{0.5}As$, and a contact layer 25 made from p-type GaAs, to thereby form a stacked semiconductor layer 31 having a stripe pattern corresponding to the arrangement pattern of the masks 61.

While not shown in FIGS. 13A and 13B, the active layer 23 has a SCH-MQW structure in which first and second light confinement layers are formed on lower and upper sides respectively and quantum well layers and quantum barrier layers are stacked between the first and second light confinement layers.

As shown in FIG. 13B, the stripe-patterned stacked semiconductor layer 31 is selectively etched from the contact layer 25 side to a depth reaching the second cladding layer 24, to form a pair of grooves on both sides of each stripe portion of the stacked semiconductor layer 31 along the extending direction of the stripe portion of the semiconductor layer 31 and also to form a stripe-like ridge 27 between the pair of the grooves 28.

Figure 14:
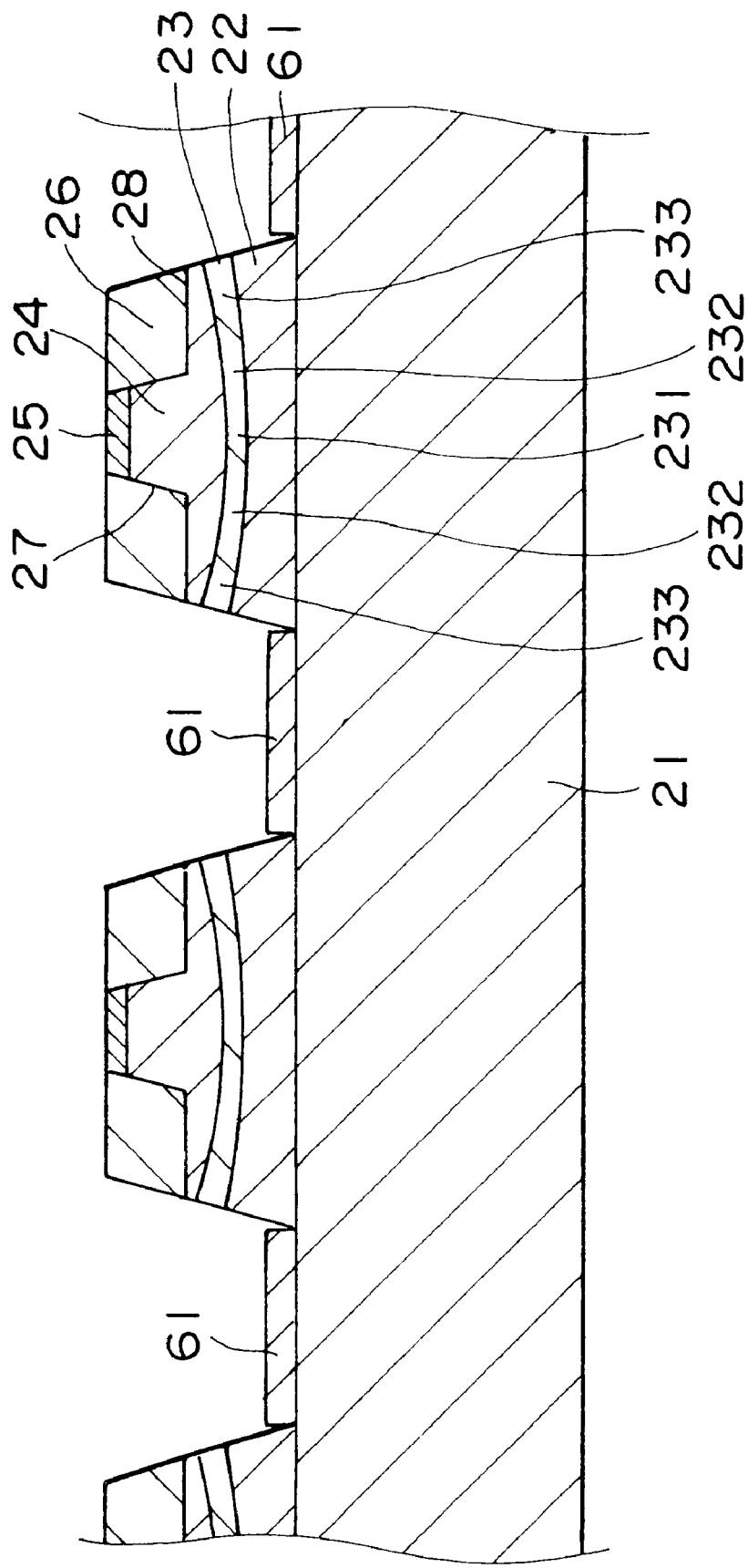
FIG. 14 is a schematic sectional view showing a method of producing a semiconductor laser according to a further embodiment of the present invention.

As shown in FIG. 14, a current constriction layer 26 made from n-type GaAs is buried on the second cladding layer 24 exposed in the grooves 28.

While not shown, a first electrode 29 made from Cr or TiPt is deposited on the contact layer 25 and the current constriction layer 26 in such a manner as to be in ohmic-contact therewith, and a second electrode 30 made from Au is deposited on the back surface of the substrate 21 in such a manner as to be in ohmic-contact therewith.

The expitaxial growth of the above-described semiconductor layers can be performed by the MOCVD method, MBE method or LPE method.

In this way, a plurality of semiconductor laser elements can be simultaneously formed on the common substrate 21. The semiconductor laser elements can be divided to be used for single-beam laser devices or can be configured as a multi-beam laser device as it is.

In the case of forming the masks 61 on the substrate 21 and forming the stacked semiconductor layer 31 by epitaxial growth through the gaps between the masks 61 as described above, a source gas supplied to the mask 61 for epitaxial growth is not deposited thereon, being moved to the gap between the masks 61, and is deposited and epitaxially grown on the portion of the substrate 21 exposed through the gap between the masks 61. As a result, the growth rate of the film at the positions of the substrate 21 located at the edges of the gap between the masks 61 becomes higher, and thereby the thickness of the growth film thereat becomes larger.

The thickness of the active layer 23 is uniform along the direction (called the first direction) perpendicular to the paper planes of FIGS. 13A, 13B and 14 but is non-uniform in the direction (called second direction) perpendicular to the above first direction. To be more specific, in the direction perpendicular to the above first direction, the thickness of the active layer 23 is thinnest at the position of the substrate 21 corresponding to the center of the gap between the masks 61 and is gradually increased toward the positions of the substrate 21 corresponding to both side ends of the gap between the masks 61. As a result, in the case of forming the ridge 27 at the position of the substrate 21 corresponding to the center of the gap between the masks 61, the thickness of the active layer 23 is thinnest at the gain region 231 formed under the ridge 27 at which current is constricted by the current constriction layer 26, and is gradually increased toward the saturable absorption region 232 located outside the gain region 231 and further toward the outside region 233 located outside the saturable absorption region 232. That is to say, the thicknesses of the first and second light confinement layers, quantum well layers, and quantum barrier layers constituting the active layer having the SCH-MQW structure are all gradually increased from the center gain region 231 to the outside region 233.

In the above method shown in FIGS. 13A, 13B and 14, the selective epitaxial growth masks 61 are deposited on the substrate 21 to form the semiconductor layer with its thickness increased from the center to both the sides of each stripe in the width direction; however, the masks 61 may be mounted on the substrate 21. Alternatively, there may be adopted a method shown in FIG. 15A, in which stripe-like metal masks 71 spaced at specific intervals are disposed over the surface of the substrate 21 in such a manner as to face thereto, and the above-described semiconductor layers, that is, the first cladding layer 22 made from n-type $Al_{0.5}Ga_{0.5}As$, active layer 23, second cladding layer 24 and contact layer 25 are sequentially grown on the substrate 21 via the masks 71, to form the stacked semiconductor layer 31 having a stripe pattern corresponding to the arrangement pattern of the masks 71.

While not shown, the active layer 23 has a SCH-MQW structure in which first and second light confinement layers are formed on the lower and upper sides respectively and quantum well layers and quantum barrier layers are stacked therebetween.

Figure 15A:
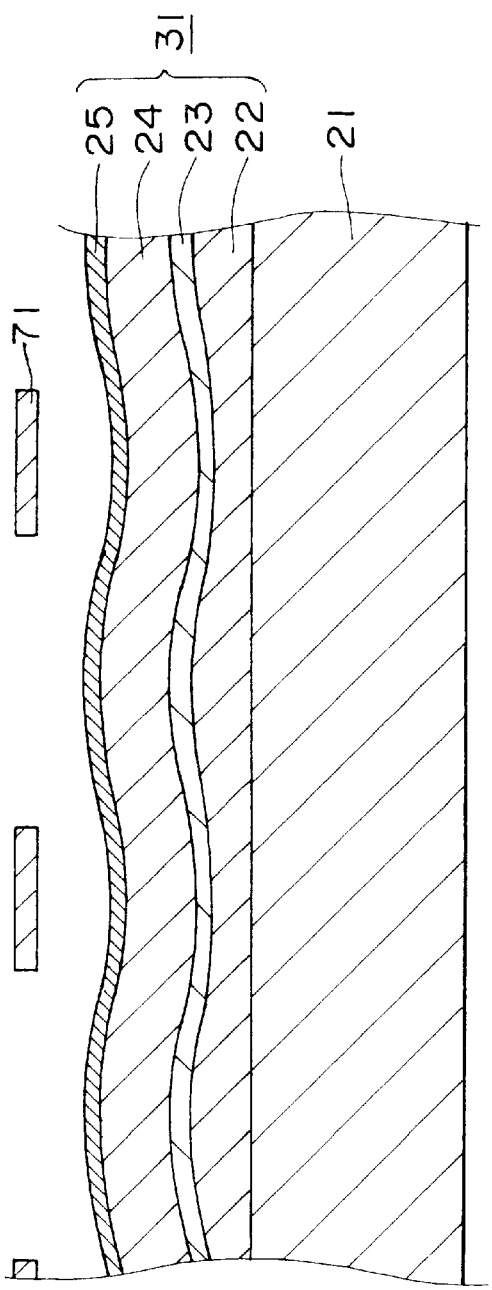
FIGS. 15A and 15B are schematic sectional views showing a method of producing a semiconductor laser according to a further embodiment of the present invention.
Figure 15B:
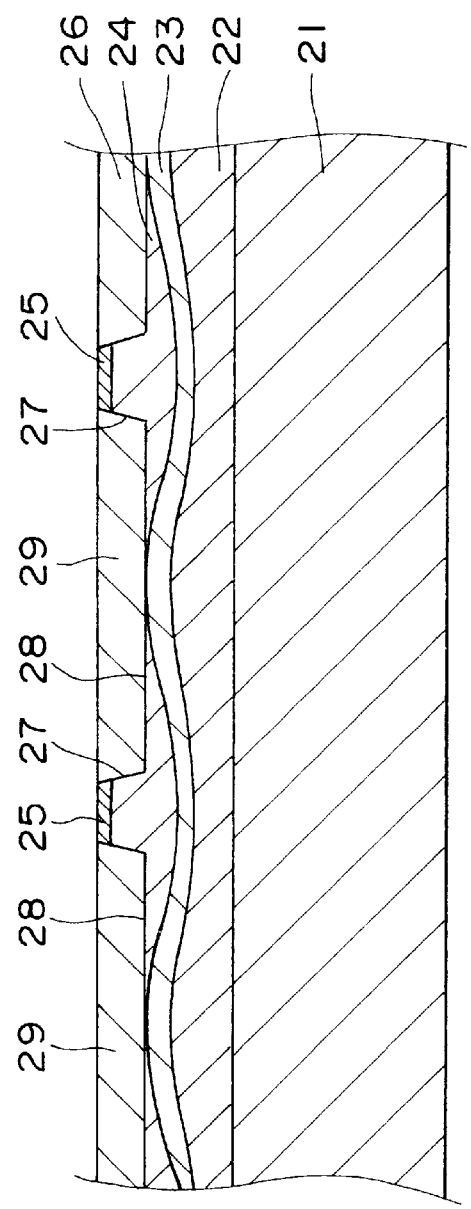
Figure 16:
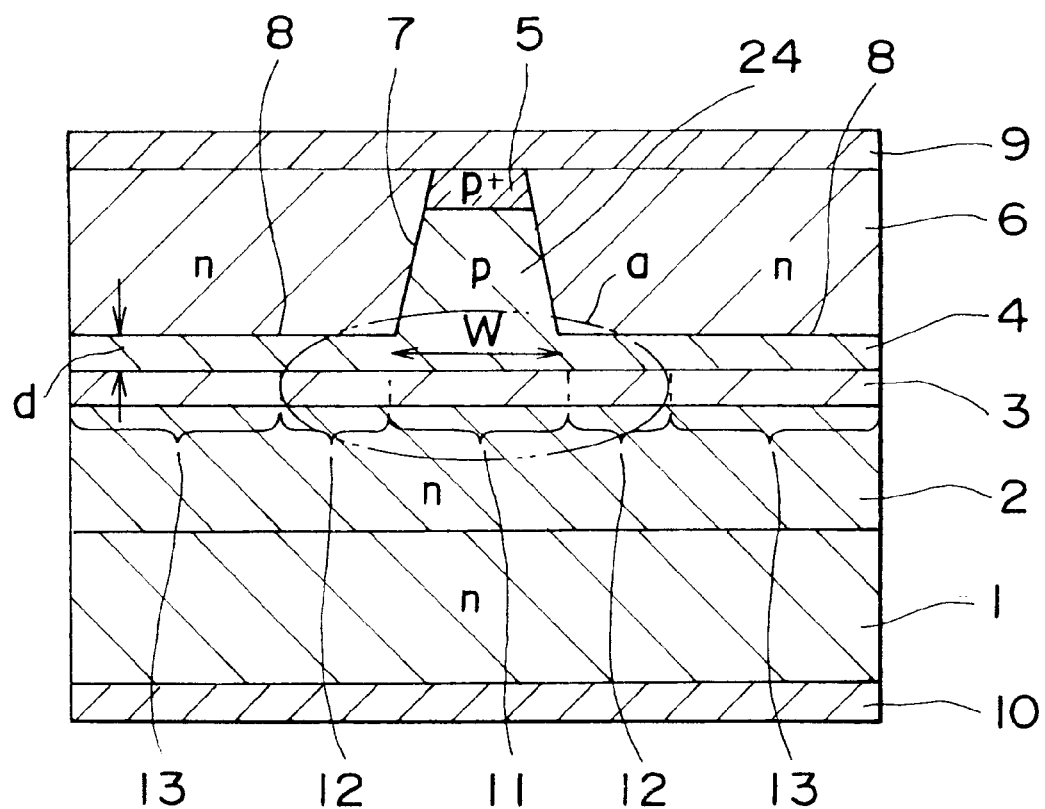
FIG. 16 is a schematic sectional view showing a related art semiconductor laser.

Then, as shown in FIG. 15B, the stacked semiconductor layer 31 is selectively etched from the contact layer 25 side to a depth reaching the second cladding layer 24, to thereby form a plurality of stripe-like grooves 28 in such a manner as to form ridges 27 along the thinned portions formed directly under the stripe-like masks 71. A current constriction layer 26 made from n-type GaAs is buried on the second cladding layer 24 exposed in the grooves 28.

While not shown, a first electrode 29 made from Cr or TiPt is deposited on the contact layer 25 and the current constriction layer 26 in such a manner as to be in ohmic-contact therewith, and a second electrode 30 made from Au is deposited on the back surface of the substrate 21 in such a manner as to be ohmic-contact therewith.

According to this method, since the source gas for epitaxial growth flows even to a portion of the substrate 21 directly under the mask 71, a film is epitaxially grown on such a portion in co-operation of the migration effect by selecting the distance between the mask 71 and the substrate 21, the width of the mask 71, and the gap between the masks 71. In this case, the supplied amount of the source gas to the portion directly under the mask 71 can be set to be smaller than the supplied amount of the source gas to a portion located at the gap between the masks 71. With this configuration, the growth rate of the film, that is, the film thickness can be gradually increased from the center to both the sides of the portion directly under the mask 71.

Even in this case, a plurality of semiconductor laser elements can be simultaneously formed on the common substrate 21. The semiconductor laser elements can be divided to be used for single-beam laser devices or can be configured as a multi-beam laser device as it is.

The epitaxial growth of the above-described semiconductor layers can be also performed by the MOCVD method, MBE method or LPE method.

In the semiconductor laser according to the sixth embodiment, the thicknesses of the quantum well layer and the quantum barrier layer in the MQW structure of the active layer are gradually increased from the gain region 231 toward the saturable absorption region 232 and further toward the outside region 233. With this configuration, letting average effective band gaps in the regions 231, 232 and 233 be $Eg_1$, $Eg_2$ and $Eg_3$, there simultaneously occur an effect of $Eg_1 > Eg_2 > Eg_3$ due to the change in thickness of the quantum well layer and an effect of $Eg_1 < Eg_2 < Eg_3$ due to the change in thickness of the quantum barrier layer. However, since the thickness of the quantum barrier layer is smaller than that of the quantum well layer, the effect of $Eg_1 > Eg_2 > Eg_3$ due to the change in thickness of the quantum well layer becomes dominant.

Accordingly, even in the semiconductor laser in the sixth embodiment, because of a property of carriers easy to migrate from a region having a large band gap to a region having a small band gap, carriers generated in the saturable absorption region 232 due to optical absorption readily migrate to the outside region 233, with a result that the effective carrier lifetime in the saturable absorption region 232 is shortened. Accordingly, the ability of the saturable absorption region 232 is enhanced, to allow self pulsation to be sustained at a high optical output and/or at a high operational temperature. As a result, the allowable range of the width W of the gain region 231 or the thickness "d" of the second cladding layer 24 under the current constriction layer 26 can be made large.

In the method of producing the semiconductor laser using the masks 61 shown in FIGS. 13 and 14 and in the method of producing the semiconductor laser using the masks 71 shown in FIGS. 15A and 15B, the epitaxial growth can be performed only by the first expitaxial growth step for forming the stacked semiconductor layer 31 by continuous epitaxial growth and the second epitaxial growth step for forming the current constriction layer 26 by epitaxial growth, so that the number of the epitaxial growth steps is not increased and thereby the mass-productivity is not lowered.

In the sixth embodiment, the active layer is configured as that having the SCH-MQW structure; however, it may be configured as that having a single quantum wire structure or a multiple quantum wire structure, or a single quantum dot structure or a multiple quantum dot structure. In these cases, by changing the thickness or average thickness of the quantum wires, or the size (volume), average volume or number density of the quantum dots in the width direction of the stripe portion of the active layer, the same effect as that described in this embodiment can be obtained.

The semiconductor laser including the active layer having the quantum wire or quantum dot structure can be produced in a method substantially similar to the method of producing the semiconductor laser using the masks 61 or 71 in this embodiment. To be more specific, in place of the active layer having the SCH-MQW structure, the active layer having the quantum wire or quantum dot structure is produced in accordance with the first production method described with reference to FIGS. 13A, 13B and 14 in such a manner that the thickness of the quantum wires of the quantum wire structure or the volume or number density of the quantum dots of the quantum dot structure is largest at a position of the substrate 21 corresponding to the center of the stripe-like mask 61 and becomes smaller toward both the sides of the stripe-like mask 61.

The semiconductor laser including the active layer having the quantum wire or quantum dot structure can be also produced in the second production method described with reference to FIGS. 15A and 15B in such a manner that the thickness of the quantum wires of the quantum wire structure or the volume or number density of the quantum dots of the quantum dot structure is largest at a position of the substrate 21 corresponding to the center of the stripe-like mask 71 and becomes smaller toward both the sides of the stripe-like mask 71.

In each of the above-described production methods, the stacked semiconductor layer is formed in such a manner that the grooves for forming the ridge is formed and the current constriction layer 26 is formed by epitaxial growth in the grooves; however, it may be formed in accordance with the above-described third production method in which ions of an impurity, for example, an n-type impurity are implanted or diffused in the stacked semiconductor layer to form a current constriction layer without formation of the grooves.

According to the present invention, in the method shown in FIGS. 13A to 15B, the active layer is formed in such a manner that the effective band gap is changed in the above-described second direction; however, the saturable absorption layer may be formed in accordance with the above-described fifth or sixth method in such a manner that the band gap is uniform in the first direction and becomes smaller to the outside in the second direction perpendicular to the first direction.

The semiconductor laser and its production method according to the present invention are not limited to the above-described embodiments but may be produced in accordance with a method obtained by combination of some of the above-described embodiments. In this case, it is expected to obtain a larger effect.

The conduction type of the substrate 21 or each of the semiconductor layers formed thereon may be opposed to that described above.

In the above-described embodiments, the current constriction means is configured as a current constriction layer made from a semiconductor; however, it may be configured as a space or an insulator.

The specific terms such as materials for forming the substrate 21 and the semiconductor layers, composition of each material, film thickness, and concentration of carriers in the above-described embodiments can be variously changed or modified without departing from the scope of the present invention.

The epitaxial growth of the semiconductor layers performed by the MOCVD method, MBE method or LPE method in the above-described embodiments may be performed by a gas source MBE method, ALE method or the like.

The semiconductor laser according to the present invention is not limited to the above-described stripe structure but may be applied to other structures insofar as the structure has a gain region, a saturable absorption region and an outside region.

What is claimed is:

1. A semiconductor laser comprising:
   a first cladding layer;
   an active layer;
   a second cladding layer; and
   a current constriction means for defining a current injection region in said active layer;

wherein said active layer has a gain region which acquires an optical gain by current injection thereto; a saturable absorption region in which current injection thereto little occurs and light effusion thereto occurs; and an outside region, being in contact with said saturable absorption region, in which current injection thereto little occurs and light effusion thereto little occurs;

an effective band gap of said saturable absorption region is larger than that of said outside region; and said active layer has an arc-shaped cross section in a direction perpendicular to a resonator length direction such that said second cladding layer has a thickness greater at said gain region than at said saturable absorption region and a thickness greater at said saturable absorption region than at said outside region, and such that said first cladding layer has a thickness greater at said outside region than at said saturable absorption region and a thickness greater at said saturable absorption region than at said gain region.

2. A semiconductor laser according to claim 1, wherein each of said saturable absorption region and said outside region has a double hetero structure; and an effective band gap of said saturable absorption region is larger than that of said outside region.

3. A semiconductor laser according to claim 1, wherein each of said saturable absorption region and said outside region has a single or multiple quantum well structure; and an effective band gap of a quantum well layer in said saturable absorption region is larger than that of an quantum well layer in said outside region.

4. A semiconductor laser according to claim 1, wherein each of said saturable absorption region and said outside region has a single or multiple quantum well structure; and a thickness of a quantum well layer in said saturable absorption region is smaller that that of an quantum well layers in said outside region.

5. A semiconductor laser according to claim 1, wherein each of said saturable absorption region and said outside region has a multiple quantum well structure; and a thickness of each quantum well barrier layer between two quantum well layers in said saturable absorption region is larger than that of each quantum well barrier layer between two quantum will layers in said outside region.

6. A semiconductor laser according to claim 1, wherein each of said saturable absorption region and said outside region has a multiple quantum well structure; and the number of quantum well layers in said saturable absorption region is smaller than that of quantum well layers in said outside region.

7. A semiconductor laser according to claim 1, wherein each of said saturable absorption region and said outside region has a quantum wire structure; and a band gap of a quantum wire in said saturable absorption region is larger than that of a quantum wire in said outside region.

8. A semiconductor laser according to claim 1, wherein each of said saturable absorption region and said outside region has a quantum wire structure; and a thickness of a quantum wire in said saturable absorption region is smaller than that of a quantum wire in said outside region.

9. A semiconductor laser according to claim 1, wherein each of said saturable absorption region and said outside region has a quantum wire structure; and the number of quantum wires in said saturable absorption region is smaller than that of quantum wires in said outside region.

10. A semiconductor laser according to claim 1, wherein each of said saturable absorption region and said outside region has a quantum wire structure; and at least one of quantum wires is formed in such a manner as to cross from said saturable absorption region to said outside region.

11. A semiconductor laser according to claim 1, wherein each of said saturable absorption region and said outside region has a plurality of quantum dot structures; and an average band gap of quantum dots in said saturable absorption region is larger than that of quantum dots in said outside region.

12. A semiconductor laser according to claim 1, wherein each of said saturable absorption region and said outside region has a plurality of quantum dot structures; and an average volume of quantum dots in said saturable absorption region is smaller than that of quantum dots in said outside region.

13. A semiconductor laser according to claim 1, wherein each of said saturable absorption region and said outside region has a plurality of quantum dot structures; and a number density of quantum dots in said saturable absorption region is smaller than that of quantum dots in said outside region.

14. A semiconductor laser according to claim 1, wherein said outside region has a double hetero structure; and said saturable absorption region has a quantum well structure, a quantum wire structure, or a quantum dot structure.

15. A semiconductor laser according to claim 1, wherein said outside region has a quantum well structure; and said saturable absorption region has a quantum wire structure or a quantum dot structure.

16. A semiconductor laser according to claim 1, wherein said outside region has a quantum wire structure; and said saturable absorption region has a quantum dot structure.

17. A semiconductor laser comprising:

a first cladding layer;

an active layer;

a second cladding layer; and a current constriction means for defining a current injection region in said active layer;

wherein said active layer has a gain region which acquires an optical gain by current injection;

a saturable absorption layer is provided in at least one of said first and second cladding layers, said saturable absorption layer having a saturable absorption region which has an effective band gap nearly equal to or narrower than that of said active layer and in which light effusion thereto occurs, and an outside region, being in contact with said saturable absorption, which has an effective band gap smaller than that of said saturable absorption region and in which light effusion thereto little occurs; and said active layer has an arc-shaped cross section in a direction perpendicular to a resonator length direction such that said second cladding layer has a thickness greater at said gain region than at said saturable absorption region and a thickness greater at said saturable absorption region than at said outside region, and such that said first cladding layer has a thickness greater at said outside region than at said saturable absorption region and a thickness greater at said saturable absorption region than at said gain region.

18. A semiconductor laser according to claim 17, wherein each of said saturable absorption region and said outside region has a double hetero structure; and an effective band gap of said saturable absorption region is larger than that of said outside region.

19. A semiconductor laser according to claim 17, wherein each of said saturable absorption region and said outside region has a single or multiple quantum well structure; and an effective band gap of a quantum well layer in said saturable absorption region is larger than that of an quantum well layer in said outside region.

20. A semiconductor laser according to claim 17, wherein each of said saturable absorption region and said outside region has a single or multiple quantum well structure; and a thickness of a quantum well layer in said saturable absorption region is smaller than that of an quantum well layer in said outside region.

21. A semiconductor laser according to claim 17, wherein each of said saturable absorption region and said outside region has a multiple quantum well structure; and a thickness of each quantum well barrier layer between two quantum well layers in said saturable absorption region is larger than that of each quantum well barrier layer between two quantum well layers in said outside region.

22. A semiconductor laser according to claim 17, wherein each of said saturable absorption region and said outside region has a multiple quantum well structure; and the number of quantum well layers in said saturable absorption region is smaller than that of quantum well layers in said outside region.

23. A semiconductor laser according to claim 17, wherein each of said saturable absorption region and said outside region has a quantum wire structure; and a band gap of a quantum wire in said saturable absorption region is larger than that of a quantum wire in said outside region.

24. A semiconductor laser according to claim 17, wherein each of said saturable absorption region and said outside region has a quantum wire structure; and a thickness of a quantum wire in said saturable absorption region is smaller than that of a quantum wire in said outside region.

25. A semiconductor laser according to claim 17, wherein each of said saturable absorption region and said outside region has a quantum wire structure; and the number of quantum wires in said saturable absorption region is smaller than that of quantum wires in said outside region.

26. A semiconductor laser according to claim 17, wherein each of said saturable absorption region and said outside region has a quantum wire structure; and at least one of quantum wires is formed in such a manner as to cross from said saturable absorption region to said outside region.

27. A semiconductor laser according to claim 17, wherein each of said saturable absorption region and said outside region has a plurality of quantum dot structures; and an average band gap of quantum dots in said saturable absorption region is larger than that of quantum dots in said outside region.

28. A semiconductor laser according to claim 17, wherein each of said saturable absorption region and said outside region has a plurality of quantum dot structures; and an average volume of quantum dots in said saturable absorption region is smaller than that of quantum dots in said outside region.

29. A semiconductor laser according to claim 17, wherein each of said saturable absorption region and said outside region has a plurality of quantum dot structures; and a number density of quantum dots in said saturable absorption region is smaller than that of quantum dots in said outside region.

30. A semiconductor laser according to claim 17, wherein said outside region has a double hetero structure; and said saturable absorption region has a quantum well structure, a quantum wire structure, or a quantum dot structure.

31. A semiconductor laser according to claim 17, wherein said outside region has a quantum well structure; and said saturable absorption region has a quantum wire structure or a quantum dot structure.

32. A semiconductor laser according to claim 17, wherein said outside region has a quantum wire structure; and said saturable absorption region has a quantum dot structure.

* * * * *